United States Patent
Goss et al.

(10) Patent No.: US 9,741,436 B2
(45) Date of Patent: Aug. 22, 2017

(54) DYNAMICALLY CONTROLLING AN OPERATION EXECUTION TIME FOR A STORAGE DEVICE

(75) Inventors: Ryan J. Goss, Lakeville, MN (US); Kevin A. Gomez, Eden Prairie, MN (US); Mark A. Gaertner, Vadnais Heights, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 924 days.

(21) Appl. No.: 12/833,589

(22) Filed: Jul. 9, 2010

(65) Prior Publication Data

US 2012/0011301 A1    Jan. 12, 2012

(51) Int. Cl.
G06F 12/00 (2006.01)
G11C 16/10 (2006.01)
G06F 12/02 (2006.01)

(52) U.S. Cl.
CPC .......... *G11C 16/10* (2013.01); *G06F 12/0246* (2013.01)

(58) Field of Classification Search
USPC ........................................................ 711/154
See application file for complete search history.

(56) References Cited

U.S. PATENT DOCUMENTS

| 5,402,370 | A | | 3/1995 | Fazio et al. |
| 5,465,354 | A | * | 11/1995 | Hirosawa et al. ............ 718/106 |
| 5,812,457 | A | | 9/1998 | Arase |
| 6,205,055 | B1 | | 3/2001 | Parker |
| 7,630,249 | B2 | * | 12/2009 | Fong et al. .............. 365/185.19 |
| 7,660,156 | B2 | | 2/2010 | Cernea |
| 8,364,883 | B2 | * | 1/2013 | Bennett et al. ............... 711/103 |
| 2006/0018160 | A1 | | 1/2006 | Moogat et al. |
| 2006/0285396 | A1 | | 12/2006 | Ha |
| 2007/0050669 | A1 | * | 3/2007 | Ofer et al. ........................ 714/6 |
| 2007/0255892 | A1 | | 11/2007 | Jachalsky et al. |
| 2008/0031047 | A1 | | 2/2008 | Ha |
| 2008/0181011 | A1 | | 7/2008 | Cho et al. |
| 2009/0073772 | A1 | | 3/2009 | Ha |
| 2009/0207660 | A1 | | 8/2009 | Hwang et al. |
| 2009/0257280 | A1 | | 10/2009 | Oh et al. |
| 2009/0271563 | A1 | * | 10/2009 | Gopalan et al. .............. 711/103 |
| 2009/0296486 | A1 | | 12/2009 | Kim et al. |
| 2010/0067306 | A1 | | 3/2010 | Hwang |

OTHER PUBLICATIONS

Peter Desnoyers, Empirical Evaluation of NAND Flash Memory Performance, Northeastern University, 5pp.

* cited by examiner

*Primary Examiner* — Jared Rutz
(74) *Attorney, Agent, or Firm* — Hollingsworth Davis, LLC

(57) ABSTRACT

In general, this disclosure is directed to techniques for adjusting the timing of operations for a storage device. According to one aspect of the disclosure, a method includes receiving, with at least one device, a workload indicator. The method further includes adjusting, with the at least one device, an operation execution time for the storage device responsive to at least the workload indicator. In some examples, the workload indicator may include a host demand indicator. In additional examples, the workload indicator may include a resource utilization indicator. In further examples, the operation execution time may be one of a write operation execution time or a read operation execution time.

20 Claims, 18 Drawing Sheets

DYNAMICALLY CONTROLLING AN OPERATION EXECUTION TIME FOR A STORAGE DEVICE

SUMMARY

According to one aspect of the disclosure, a method includes obtaining, with at least one device, a workload indicator. The method further includes adjusting, with the at least one device, an operation execution time for a storage device responsive to at least the workload indicator.

According to another aspect of the disclosure, a device includes a storage device, and a controller configured to obtain a workload indicator. The controller is further configured to adjust an operation execution time for the storage device responsive to at least the workload indicator.

According to another aspect of the disclosure, a computer-readable storage medium includes instructions that cause one or more processors to obtain a workload indicator. The computer-readable storage medium further includes instructions that cause one or more processors to adjust an operation execution time for a storage device responsive to at least the workload indicator These and various other features and advantages will be apparent from a reading of the following detailed description.

DETAILED DESCRIPTION

Figure 1:
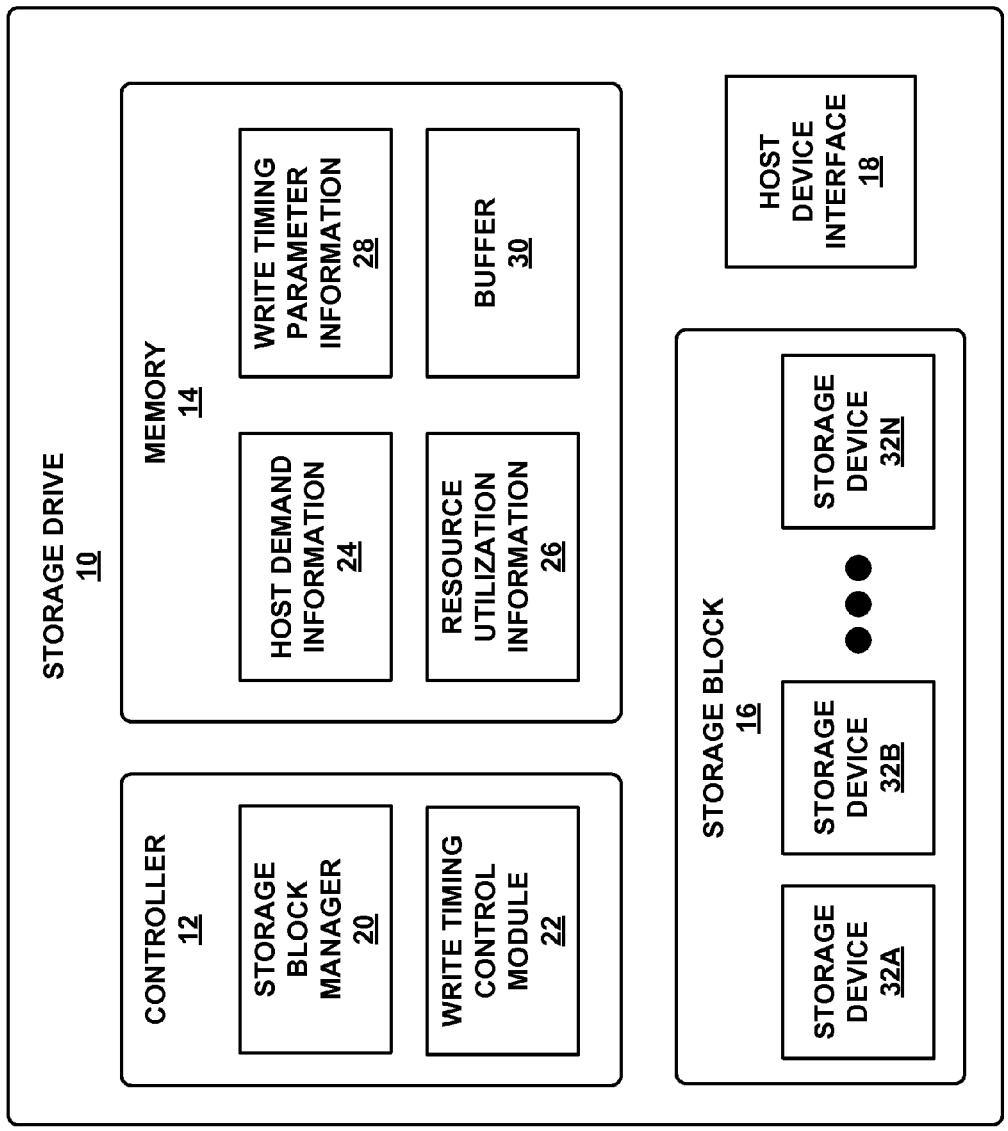
FIG. 1 is a block diagram illustrating an example storage drive according to one aspect of the disclosure.

In general, this disclosure is directed to techniques for dynamically controlling an operation execution time for a storage device. The operation execution time may, in some examples, be a write operation execution time and/or a read operation execution time. The operation execution time may be controlled in response to a workload indicator. In some examples, the workload indicator may be a host demand indicator. In additional examples, the workload indicator may be a resource utilization indicator. The techniques in this disclosure may be used to improve the endurance, reliability and/or the throughput performance of a storage drive.

Although this disclosure describes techniques for dynamically adjusting the operation execution time for any type of storage device operation (e.g., read, write, program, and erase operations), the examples in this disclosure are described primarily with respect to the dynamic adjustment of operation execution times for write operations (e.g., program and erase operations). It is recognized, however, that similar examples designed to dynamically adjust a read operation execution time are also contemplated and within the scope of this disclosure. For example, the read operations execution time for a storage device may be adjusted in response to a workload indicator in a manner similar to that which is described herein with respect to the write operations.

In a solid state drive (SSD), a memory location generally may be programmed and erased only a finite number of times. The endurance of the SSD may be related to the endurance of the individual flash devices used within the SSD. The endurance may be a function of many different metrics. One of these metrics may be the speed at which a flash cell is programmed and/or erased. As the speed at which a flash cell is programmed or erased increases, the amount of damage or wear caused to the storage cell also increases, which reduces the endurance of the flash device. In addition, as the speed at which a flash cell is programmed or erased increases, the amount of disturbance to surrounding storage cells may also increase, which can further reduce the endurance of the flash device. Conversely, as the speed at which the flash cell is programmed or erased decreases, the amount of damage, wear and/or disturbance on the flash cells decreases, thereby improving the endurance or longevity of the device.

For conventional flash devices, flash manufacturers typically select a market segment, determine an appropriate program and erase speed for that market segment, and design flash devices that are marketed for the selected speed. For example, flash manufacturers may market devices that are capable of using relatively slow program and erase execution times such as, e.g., enterprise-NAND (E-NAND) devices. During operation, the E-NAND devices may throttle host performance during times of peak write workloads that may only last for a short burst.

Conversely, flash manufacturers may also market devices that are designed to use relatively fast programming and erase times, such as, e.g., high-performance NAND flash devices. However, these devices may induce unneeded wear on the flash during a host workload that does not require the higher performance, such as, e.g., during the idle time between host burst write operations.

This disclosure provides techniques for dynamically adjusting the write operation execution time of one or more flash devices. Such techniques may be used, in some examples, to overcome one or more of the problems discussed above with respect to devices that use static program and erase times.

The write throughput of an SSD may be a function of the flash device program time and erase time. When there is high demand for write throughput (e.g. during a host burst write operation), then the dynamic write operation timing control techniques of this disclosure may, in some examples, use a relatively fast programming time to meet the increased bandwidth requirements. During a typical workload, the host device may not be bursting at high data rates. During such times, the write operation timing control techniques in this disclosure may, in some examples, throttle down the throughput performance of the flash devices. Thus, when the performance demand on the SSD is relatively low (e.g., at times when a host burst write operation is not occurring), an SSD designed according to the techniques in this disclosure may, in some examples, use a relatively slow program or erase time to help reduce the wear on the flash devices. In this manner, the techniques in this disclosure may be used, in some examples, to maximize endurance while still satisfying a given level of host demand.

FIG. 1 is a block diagram illustrating an example storage drive 10 according to one aspect of the disclosure. Storage drive 10 is configured to store and retrieve data in response to commands received from a host device. Storage drive 10 includes controller 12, memory 14, storage block 16, and host interface 18. In some examples, storage drive 10 may be a solid state drive (SSD) (e.g., a flash drive), a hard drive, or any other type of data storage device.

Storage block 16 is configured to store data for storage drive 10. Storage block 16 includes one or more storage devices 32A-32N (collectively "storage devices 32"). Storage block 16 may be communicatively coupled to controller 12, memory 14 and/or host device interface 18.

Controller 12 is configured to handle commands received from a host device to store data to and retrieve data from storage block 16. Controller 12 may also be configured to access memory 14 in order to store and retrieve information used by controller 12. Controller 12 may be communicatively coupled to a host device via host device interface 18. In some examples, controller 12 may be configured to act as a flash controller for each storage devices 32A-32N within storage block 16. Controller 12 includes storage block manager 20, and write timing control module 22.

Controller 12 may include one or more programmable processors. In some examples, the one or more programmable processors may have instructions stored therein that when executed by the one or more processors perform any of the techniques described in this disclosure. In additional examples, controller 12 may be implemented as one or more software modules. In further examples, controller 12 may be automated into custom application specific integrated circuit (ASIC) logic.

Although controller 12 is illustrated in FIG. 1 as being located within storage drive 10 and external to storage block 16, in other examples, some or all of the functionally of controller 12 may be located outside of storage drive 10 and/or within individual storage devices 32 of storage block 16. For example, the functionality of controller 12 may be distributed in control logic that spreads across multiple storage components (e.g., one or more of a storage device, a host bus adaptor (HBA), and/or a Redundant Array of Independent Disks (RAID) controller). In additional examples, some or all of the functionality of controller 12 may be implemented as a device controller for one or more of storage device 32 within storage block 16.

In some examples, controller 12 may be configured to handle commands that are issued by a solid-state drive controller operating within the host device. Such commands may include, for example, a read command that instructs storage drive 10 to return data corresponding to a particular range of logical addresses within storage drive 10. The commands may also include a write command that instructs storage drive 10 to write data to a particular range of logical addresses within storage drive 10. In some examples, storage drive 10 may read and write data as logical blocks of data and the host device may address such logical blocks of data by using logical block addresses (LBAs).

Storage block manager 20 is configured to convert the read and write commands received via host device interface 18 into read operation requests and write operation requests capable of being executed by storage devices 32 within storage block 16. Storage block manager 20 may be further configured to translate addresses between logical addresses and physical addresses, and to allocate data among the various storage devices 32. In some examples, storage block manager 20 may be further configured to request internal data management operations, such as, e.g., metadata operations and garbage collection operations, to manage the data stored within storage block 16.

In response to receiving a read command from a host device via host interface 18, storage block manager 20 may translate the logical address range contained in the read command to one or more physical addresses within storage block 16. Controller 12 may identify which storage devices 32 within storage block 16 contain the storage cells associated with the physical addresses. After identifying the storage devices 32, controller 12 may issue one or more read operation requests to each of the identified storage devices 32. The read operation requests may include a physical address range specifying one or more storage cells from which data should be obtained.

In response to receiving a read operation request from controller 12, storage devices 32 may perform the read operation and return the requested data to controller 12. A read operation, as used herein, may include any operation that reads or detects the current state of the storage cells within storage block 16. After receiving the data from storage devices 32, controller 12 may package the data into one or more data units (e.g., logical blocks), and return the data units to the host device via host interface 18.

In response to receiving a write command from a host device via host interface 18, storage block manager 20 may translate the logical address range contained in the write command to one or more physical addresses within storage block 16. Controller 12 may then identify which storage devices 32 within storage block 16 contain the storage cells associated with the physical addresses. After identifying the storage devices 32, controller 12 may issue one or more write operation requests to each of the identified storage devices 32. In some examples, the write operation requests may include program operation requests and/or erase operation requests. Program operation requests may include an address range specifying one or more storage cells for which data should be written. Program operation requests may also include data that is to be written to the storage cells specified by the address range. Erase operation requests may include an address range specifying which blocks should be erased within the respective storage device 32.

In some examples, prior to issuing a write operation request, controller 12 may determine if the identified storage devices 32 are available to perform the requested write operations. For storage devices that are currently available, controller 12 may issue the write operation requests directly to the storage devices 32 corresponding to the request.

For any storage device 32 that is not currently available, controller 12 may issue the write operation requests to buffer 30. In some examples, controller 12 may place the write operation request in a queue corresponding to the storage device 30 for which the write operation is directed. After the respective storage device 32 becomes available, storage device 32 may retrieve the write operation request from buffer 30 and perform the corresponding write operation. In examples where buffer 30 includes a queue, storage device 32 may retrieve the write operation requests in the order in which such requests were placed in the queue.

In response to receiving or retrieving a write operation request, storage devices 32 may perform the requested write operation thereby storing the data within storage block 16. A write operation, as used herein, may refer to any operation that modifies the state of the storage cells within storage block 16.

In examples where the storage devices 32 perform both program operations and erase operations, if controller 12 needs to overwrite data within one of storage devices 32, controller 12 may issue an erase operation request prior to issuing a program operation request. Upon receiving the erase operation request, storage devices 32 may perform an erase operation. The erase operation may reset the storage cells to a default state wherein data can be subsequently written to the storage cells. After the storage cells have been reset to a default state, controller 12 may issue a write operation request causing storage devices 32 to write the data to the appropriate cells.

According to one or more aspects of this disclosure, write timing control module 22 is configured to dynamically control the write operation execution time for storage devices 32 within storage block 16. For example, write timing control module 22 may be configured to obtain a workload indicator, and to adjust a write operation execution time for the storage device 32 responsive to the workload indicator. As used herein, the write operation execution time may refer to an amount of time used by storage block 16 to perform write operations, e.g., program operations and/or erase operations.

In some examples, the workload indicator may include a host demand indicator. The host demand indicator may be any information indicative of a level of host demand placed on storage drive 10. For example, the host demand indicator may indicate one or more of the following pieces of information: a current data rate at which the host device is writing data to storage drive 10, an expected data rate at which the host device expects to be able to write data to storage drive 10, a maximum data rate at which the host device writes data to storage drive 10, a data rate at which the host device performs burst write operations, the throughput needed by storage drive 10 to handle write operations at substantially the same rate as that at which such operations are requested, and an amount of input/output (I/O) traffic that is or has occurred with respect to storage drive 10.

In additional examples, the workload indicator may include a resource utilization indicator. The resource utilization indicator may be any information indicative of an amount of resource utilization within storage drive 10 or an amount of resources available within storage drive 10. For example, the resource utilization indicator may indicate one or more of the following pieces of information: a level at which resources are being utilized within storage block 16, a level of available resources within storage block 16, a number of storage devices 32 within the storage block 16, a saturation level within buffer 30, the amount of free space within buffer 30, a level of saturation of one or more queues within buffer 30, and a percentage of available resources being used within storage drive 10.

In some examples, write timing control module 22 may be configured to obtain the workload indicator by monitoring operating conditions for storage device 10, and determining the workload indicator based on the operating conditions. Example operating conditions may include incoming input/output (I/O) traffic for storage device 10 used to determine a host demand indicator, and a percentage of available resources being used for storage device 10, which may be used to determine a resource utilization indicator. Other host demand information and/or resource utilization information as discussed in further detail in this disclosure may also serve as example operating conditions.

In additional examples, write timing control module 22 may be configured to obtain the workload indicator by receiving monitored data from an external monitoring component, and determining the workload indicator based on the monitored data. For example, the monitored data may be operating conditions for storage device 10 as described above. As another example, write timing control module 22 may determine a host demand workload indicator based on information regarding the rate or frequency at which the host device performs write operations. As a further example, write timing control module 22 may determine a resource utilization workload indicator based on information regarding the saturation of buffer 30 (e.g., the difference between the total amount of space within buffer 30 and the free space within buffer 30).

In additional examples, write timing control module 22 may be configured obtain a workload indicator by receiving the workload indicator from an external component. For example, an external component may determine a workload indicator based on operating conditions for storage device 10, and write timing control module 22 may receive the workload indicator from the external component. In some examples, write timing control module 22 may be configured to receive a workload indicator from host device via host device interface 18. In additional examples, write timing control module 22 may be configured to retrieve a workload indicator from memory 14.

FIGS. 6-23 provide additional techniques that write timing control module 22 may use to dynamically control write operation execution time. The disclosure, however, is not limited to such techniques. Rather, any technique that can be used for dynamically adjusting a write operation execution time is within the scope of this disclosure.

In some examples, the storage cells within storage devices 32 of storage block 16 may be formed using one or more floating-gate transistors. This may be the case when storage devices 32 are implemented as flash devices and/or NAND flash devices. In such examples, storage devices 32 may apply one or more programming pulses to a storage cell in order to program the floating-gate voltage of the storage cell to a given program voltage level corresponding to the data bits that are to be stored within the storage cell. In addition, storage devices 32 may apply one or more erase pulses to a set of storage cells in order to reset the floating-gate voltage of each of the storage cells to a non-programmed voltage level for future programming.

In some examples, a programming pulse may refer to a voltage pulse applied between two different terminals of a storage cell, e.g., a first programming terminal and a second programming terminal. Similarly, in some examples, an erase pulse may also refer to a voltage pulse applied between two different terminals of a storage cell, e.g., a first erase terminal and a second erase terminal. The programming terminals and the erase terminals, in some examples, may be the same terminals. For example, the programming and erase pulses may be applied between a control gate terminal of a storage cell and a substrate terminal of the storage cell. Although the programming and erase pulses may be applied to the same terminals of a storage cell, such pulses may have different voltage levels and/or durations. In other examples, the programming and erase may not be applied to the same terminals.

As used herein, the term "voltage level" may refer to the amplitude of a voltage pulse applied between two different terminals of a storage cell. In some examples, the amplitude of the voltage pulse may refer to a peak-to-peak amplitude of the voltage pulse. The terms "pulse width" or "pulse duration" for a voltage pulse, as used herein, may refer to the amount of time between the leading edge and trailing edge of the voltage pulse applied between two different terminals.

The voltage levels or amplitudes used for a programming pulse may, in some non-limiting examples, be selected from voltage levels within a range of approximately 13 volts (V) to approximately 20 V, and more particularly, within a range of approximately 14.5 V to approximately 19 V. The voltage levels or amplitudes for an erase pulse may, in some examples, be selected from voltage levels within a range of approximately 18 V to approximately 21 V, and more particularly, within a range of approximately 19 V to approximately 20 V.

The pulse width or pulse duration used for a programming pulse may, in some non-limiting examples, be selected from time durations within a range of approximately 10 microseconds ($\mu s$) to approximately 50 $\mu s$, and more particularly, within a range of approximately 20 $\mu s$ to approximately 40 $\mu s$. The pulse width or pulse duration used for an erase pulse may, in some examples, be selected from time durations within a range of approximately 200 $\mu s$ to approximately 500 $\mu s$, and more particularly, within a range of approximately 250 $\mu s$ to approximately 450 $\mu s$.

In some examples, a program operation may include a sequence of programming pulses. The pulses within the sequence of pulses may, in some examples, have an identical amplitudes and durations or, in other examples, different amplitudes and durations. In such examples, when one of storage devices 32A-32N performs a program operation, each programming pulse may incrementally increase the floating-gate voltage. In between the programming pulses, the storage device 32 may perform internal read operations to determine if the floating-gate voltage has reached the voltage level or range corresponding to the data to be stored in the cell. Once the floating-gate voltage has reached the appropriate voltage level, the storage device 32 may cease the programming pulse sequence without applying the remainder of the programming pulses. If all of the programming pulses within the sequence of programming pulses have been applied and the appropriate voltage level has still not been reached, the storage device 32 regards the sequence of programming pulses an unsuccessful sequence. In such examples, the storage device 32 may initiate another sequence of programming pulses or mark the storage cells as "unusable." Similarly, an erase operation may include, in some examples, a sequence of erase pulses.

As used herein, the "number of programming pulses" may refer to the number of pulses within a sequence of programming pulses used for a programming operation. Similarly, the "number of programming pulses," as used herein, may refer to the number of pulses within a sequence of erase pulses used for an erase operation.

Write timing control module 22 may adjust the timing for the performance of a write operation in a variety of ways. In some examples, write timing control module 22 may adjust a voltage level for a programming pulse or an erase pulse used by one or more of storage devices 32 within storage block 16. For example, write timing control module 22 may cause one or more of storage devices 32 to increase the voltage level of a programming or erase pulse to decrease the write operation execution time of the program or erase operation. Similarly, write timing control module 22 may cause one or more of storage devices 32 to decrease the voltage level of a programming or erase pulse to increase the write operation execution time of the program or erase operation.

In examples where the programming or erase operations include a sequence of programming and/or erase pulses, write timing control module 22 may, in some examples, adjust the timing for the performance of a write operation by adjusting the voltage level of the initial voltage pulse (e.g., the start voltage) within the pulse sequence and/or adjusting the increment voltage level between the different voltage pulses. As used herein, the increment voltage level may refer to the amount of increase in the voltage level between the voltage level of a previous pulse and a voltage level for a subsequent voltage pulse within a sequence of voltage pulses (e.g., the size of voltage step between the voltage pulses).

In additional examples, write timing control module 22 may adjust a width or duration of a programming pulse or an erase pulse used by one or more of storage devices 32 within storage block 16. For example, write timing control module 22 may cause one or more of storage devices 32 to increase the pulse duration of a programming or erase pulse to decrease the write operation execution time of the program or erase operation. Similarly, write timing control module 22 may cause one or more of storage devices 32 to decrease the pulse duration of a programming or erase pulse to increase the write operation execution time of the program or erase operation.

In further examples, write timing control module 22 may adjust the number of pulses used within a programming pulse sequence or an erase pulse sequence used by one or more of storage devices 32 within storage block 16. For example, write timing control module 22 may cause one or more of storage devices 32 to increase the number of pulses within a sequence of programming or erase pulses to increase the write operation execution time of the program or erase operation. Similarly, write timing control module 22 may cause one or more of storage devices 32 to decrease the number of pulses within a sequence of programming or erase pulses to decrease the write operation execution time of the program or erase operation.

In some examples, prior to issuing a write operation request, storage block manager 20 may direct write timing control module 22 to configure the write operation execution time of one or more of storage devices 32 within storage block 16 according to the techniques described in this disclosure. In such examples, write timing control module 22 may issue a write timing parameter configuration operation request to one or more of storage units 32 in order to directly configure the write operation execution time for storage units 32.

In some examples, prior to issuing a write timing parameter configuration operation request, write timing control module 22 may perform an authentication routine with one or more storage devices 32 according to a handshake protocol. The handshake protocol, in some examples, may be provided by the manufacturer of the storage devices 32 and designed to allow a user to enter a "factory mode" and be authenticated as a "super-user." After gaining access to the factory mode for the storage device 32, write timing control module 22 may proceed to request one or more write operation timing parameter configuration operations.

In additional examples, storage block manager 20 may configure the write operation execution times as part of the write operation requests that are delivered to the storage devices 32. In such examples, the write operation request may include a field designed to specify a target write operation execution time or a target write operation timing parameter. Write timing control module 22 may, in such examples, provide a recommended write operation execution time or write operation timing parameter to storage block manager 20. Storage block manager 20 may then place the write operation execution time or write operation timing parameter in the write operation request for the respective storage device 32.

In further examples, storage block manager 20 may configure the write operation execution times by selecting a particular type of write operation request from a set of write operation requests. For example, the set of write operation requests may include multiple write operation requests each having a different operation code (i.e., opcode) and a different associated execution time. In such examples, storage block manager 20 may configure the write operation execution times by selecting the opcode that corresponds to the write operation having the desired execution time.

Memory 14 is configured store information for use by controller 12 of storage drive 10. Memory 14 includes host demand information 24, resource utilization information 26, write timing parameter information 28, and buffer 30. Memory 14 is communicatively coupled to controller 12. In some examples, memory 14 may also be communicatively coupled to storage block 16 and/or host device interface 18.

Memory 14 may be implemented, in some examples, with a volatile storage device. For example, memory 18 may be implemented as random access memory (RAM) such as, e.g., a synchronous dynamic random access memory (SDRAM), embedded dynamic random access memory (eDRAM), static random access memory (SRAM), or the like. In some examples, all or a portion of memory may be implemented as registers within controller 12.

Host demand information 24 may include one or more host demand indicators as described in this disclosure. Resource utilization information 26 may include one or more resource utilization indicators as described in this disclosure.

Write timing parameter information 28 includes information related to the execution time of write operations within storage block 16. For example, the write timing parameter information may include a voltage level parameter defining an amplitude for a programming voltage pulse, a voltage level parameter defining an amplitude for an erase voltage pulse, a pulse duration parameter defining a pulse duration for a programming voltage pulse, a pulse duration parameter defining a pulse duration for an erase voltage pulse, a number of pulses parameter defining a number of programming pulses used in a programming pulse sequence, and a number of pulses parameter defining a number of erase pulses used in an erase pulse sequence. In some examples, write timing parameter information 28 may include write timing parameter information specific to each of the storage devices 32 within storage block 16.

In examples where storage devices 32 utilize a sequence of voltage pulses having different voltage levels to perform programming operations and/or erase operations, the write timing parameter information 28 may include a voltage level factor which is used to scale the voltage levels of the pulses within the sequence of voltage pulses. Similarly, in examples where storage devices 32 utilize a sequence of voltage pulses having different pulse durations, the write timing parameter information 28 may include a pulse duration factor which is used to scale the pulse durations of the voltage pulses within the sequence of voltage pulses.

Buffer 30 is configured to temporarily store data that is about to be written to storage block 16. In some examples, buffer 30 may include one or more queues each of which temporarily stores data allocable to the storage devices 32. In such examples, controller 12 may transfer data from the queues to the first storage device 32A-32N that is available for storing data.

In additional examples, buffer 30 may include dedicated queues, each of which stores data that is allocated for storage within a specific one of storage devices 32. For example, a first dedicated queue may store data that is allocated for storage within a first storage device 32, and a second dedicated queue may store data that is allocated for storage within a second storage device 32.

Storage devices 32 are configured to provide the storage hardware for the storage of data within storage block 16. In some examples, each of storage devices 32 may be an independent storage device that operates independently of the other storage devices 32. Storage devices 32 may be configured to perform read operations and write operations in response to commands received from controller 12. In some examples, the write operations may include program operations and erase operations. In additional examples, storage devices 32 may be configured to perform write operation execution time configuration operations, such as, e.g., one or more different types of write operation timing parameter configuration operations.

Storage devices 32 may be implemented as any type of data storage device including, e.g., solid-state data storage devices and non-solid-state data storage devices. In some examples, storage devices 32 may be implemented as block storage devices. In additional examples, storage devices 32 may be implemented as flash devices, e.g., NAND flash devices. In examples where storage devices 32 are implemented as individual flash die, controller 12 may serve as a common flash controller for storage devices 32. Although each of storage devices 32A-32N in FIG. 1 is illustrated as being the same type of storage device, storage devices 32 do not necessarily need to be the same type of device.

In some examples, storage devices 32 may be block storage devices such as, e.g., individual flash chips. In such examples, each of storage devices 32 may include a plurality of pages or physical data blocks. A page may constitute the smallest amount of data that can be read from or written to the block storage device during a given read operation or program operation. In other words, in such devices, a page may be the atomic data unit for read operations and program operations.

In additional examples, storage devices 32A-32N may be erase-before-write block storage devices such as, e.g., individual NAND flash chips. In such devices, each of storage devices 32 may include a plurality of erasure blocks. Each of the erasure blocks may include a plurality of pages of physical data blocks. Again, the page may constitute the smallest amount of data that can be read from or written to the block storage device during a given read operation or program operation. However, before any data is overwritten in a storage cell in such devices, the storage cell is erased by using an erase operation, which is distinct from the program operation. Within such a device, each erasure block may constitute the smallest amount of data that can be erased during a given erasure operation. In other words, in such devices, the erasure block may be the atomic data unit for erasure operations, and a page may be the atomic data unit for read operations and program operations.

Host device interface 18 is configured to provide two-way communication between storage drive 10 and a host device.

In some examples, host device interface 18 may deliver read and write commands from a host device to controller 12 for further processing. In additional examples, host device interface 18 may relay data between the host device, controller 12, memory 14, and/or storage block 16 as part of read and write commands. In some examples, the data may include logical blocks of data.

Host device interface 18 is communicatively coupled to controller 12 and memory 14. In some examples, host device interface 18 may also be communicatively coupled to storage block 16. Host device interface 18 is also communicatively coupled to a host device. In some examples, host device interface may communicate according to protocols such as, for example, Advanced Technology Attachment (ATA), Serial Advanced Technology Attachment (SATA), Small Computer System Interface (SCSI), Serial Attached SCSI (SAS), Internet Small Computer System Interface (iSCSI), Fibre Channel (FC), or any other means or protocol through which a host device may communicate with a data storage device.

Figure 2:
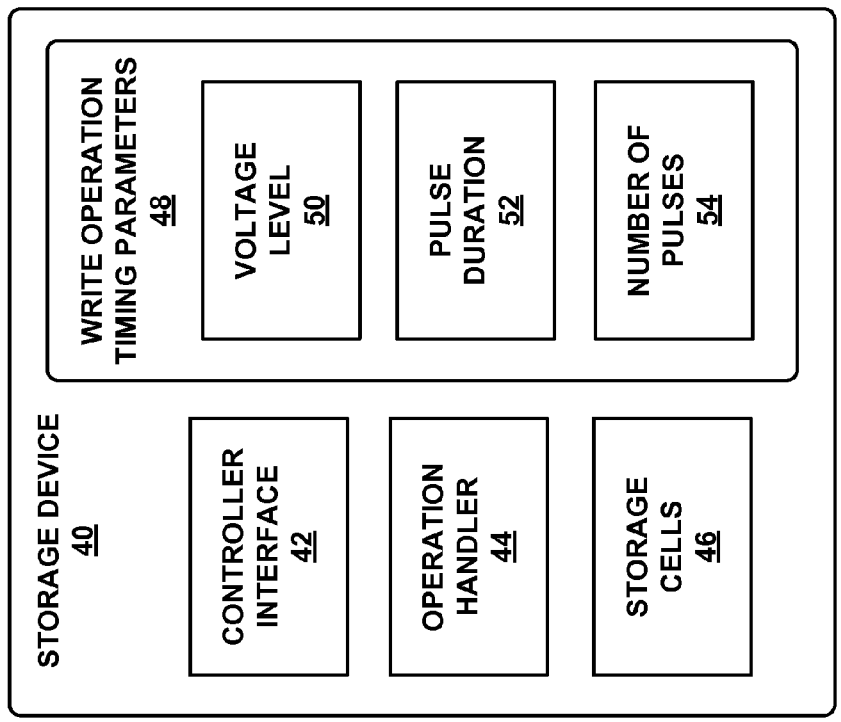
FIG. 2 is a block diagram illustrating an example storage device according to one aspect of the disclosure.

FIG. 2 is a block diagram illustrating an example storage device 40 according to one aspect of the disclosure. In some examples, storage device 40 may correspond to one of storage devices 32A-32N illustrated in FIG. 1. Storage device 40 is configured to execute and handle operations in response to operation requests received from an external controller for storage device 40. Storage device 40 includes controller interface 42, operation handler 44, storage cells 46, and write operation timing parameters 48.

Controller interface 42 is configured to receive operation requests from a controller, and relay such commands to operation handler 44. Controller interface 42 is further configured to transfer data between storage cells 46 and other components external to storage device 40. In examples where storage device 40 corresponds to one of storage devices 32A-32N in FIG. 1, controller interface 42 may be configured to receive commands from controller 12 and transfer data between storage cells 46, controller 12 and/or host device interface 18.

In some examples, controller interface 42 may include one or more of control inputs, control outputs, and a data bus. The control inputs may be used by a controller to initiate data access operations, such as, e.g., read operations, program operations, and/or erase operations. The control inputs may also be used by a controller to initiate configuration operations, such as, e.g., setting one of the write operation timing parameters 48 to a particular value. The control outputs may be used to report the status of an operation. The data bus may be used to transfer data between storage cells 46 to components external to storage device 40.

Operation handler 44 is configured to execute operations received from a controller via controller interface 42. The operations may include write operations, such as, e.g., program operations and erase operations. The operations may also include read operations. In addition, the operations may include configuration operations, such as, e.g., write operation timing parameter configuration operations.

In response to receiving a read operation request from controller interface 42, operation handler 44 may transfer one or more pages or physical data blocks indicated by the address range in the read request to controller interface 42. Controller interface 42 may use the data bus to transfer the pages of data to a device external to storage device 40 such as, e.g., controller 12 or host device interface 18.

In response to receiving an erase operation request from controller interface 42, operation handler 44 may erase the erasure block within storage cells 46 at the location indicated by the address range in the erase request. Erasing an erasure block within storage cells 46 may include resetting the voltage levels to a non-programmed state. After erasure, the erasure block is ready to be programmed.

Operation handler 44 may apply one or more erase voltage pulses to storage cells 46 within the erasure block to perform the erase operation. Operation handler 44 may use one or more of write operation timing parameters 48 to configure the voltage level and/or pulse duration of the erase pulses. In some examples, operation handler 44 may apply a sequence of erase voltage pulses to storage cells 46 within the erasure block to perform the erase operation. In such examples, operation handler 44 may use one or more of write operation timing parameters 48 to configure the number of pulses within the sequence of erase pulses.

In response to receiving an program operation request from controller interface 42, operation handler 44 may write the data received from controller interface 42 to a one or more pages within storage cells 46 indicated by the address range in the erase request. Programming storage cells 46 may include setting the voltage levels to an appropriate voltage level corresponding to the data to be written to the cells.

Similar to the erase operation, operation handler 44 may apply one or more programming voltage pulses to storage cells 46 within the erasure block to perform the program operation. Operation handler 44 may use one or more of write operation timing parameters 48 to configure the voltage level and/or pulse duration of the programming pulses. In some examples, operation handler 44 may apply a sequence of programming voltage pulses to storage cells 46 within the page to perform the program operation. In such examples, operation handler 44 may use one or more of write operation timing parameters 48 to configure the number of pulses within the sequence of program pulses.

In response to receiving a request to perform a write operation timing parameter configuration operation, operation handler 44 may set the corresponding write operation timing parameter 48 to the value indicated in the request. The write operation timing parameter configuration operation request may, for example, include a parameter to be adjusted, and a value to which the parameter should be set.

In some examples, operation handler 44 may execute write operation timing parameter configuration requests for a controller after the controller has been authenticated according to a handshake protocol and authorized as a super-user. In such examples, the handshake may be a handshake provided by the manufacturer of the storage device 40 and designed to allow a user to enter a "factory mode." In other examples, operation handler 40 may execute configuration requests regardless of whether a controller is authorized via a factory mode handshake.

In some examples, operation handler 44 may be capable of receiving a general request to increase or decrease a program operation execution time and/or an erase operation execution time to a specific amount of time. In such examples, operation handler 44 may determine the appropriate write operation timing parameters to adjust based on the general request.

Storage cells 46 are configured to store bits of data. Storage cells 46 may include a plurality of erasure blocks, each of which includes a plurality of pages. In some examples, each of the storage cells 46 may include a floating-gate transistor.

Write operation timing parameters 48 include voltage level parameter 50, pulse duration parameter 52, and number of pulses parameter 54. Voltage level parameter 50 is configured to control the voltage level or amplitude of a voltage pulse applied between two terminals of a storage cell within storage cells 46. In some examples, voltage level parameter 50 may include a programming voltage level parameter that controls the voltage level for a programming pulse. In additional examples, voltage level parameter 50 may include an erase voltage level parameter that controls the voltage level for an erase voltage pulse.

Pulse duration parameter 52 is configured to control the pulse width or duration of a voltage pulse applied between two terminals of a storage cell within storage cells 46. In some examples, pulse duration parameter 52 may include a programming pulse duration parameter that controls the pulse duration for a programming pulse. In additional examples, pulse duration parameter 52 may include an erase pulse duration parameter that controls the pulse duration for an erase voltage pulse.

Number of pulses parameter 54 is configured to control the number of pulses within a sequence of pulses. In some examples, number of pulses parameter 54 may include a number of programming pulses parameter that controls the number of pulses within a sequence of programming pulses. In additional examples, number of pulses parameter 54 may include a number of erase pulses parameter that controls the number of pulses within a sequence of erase pulses.

Figure 3:
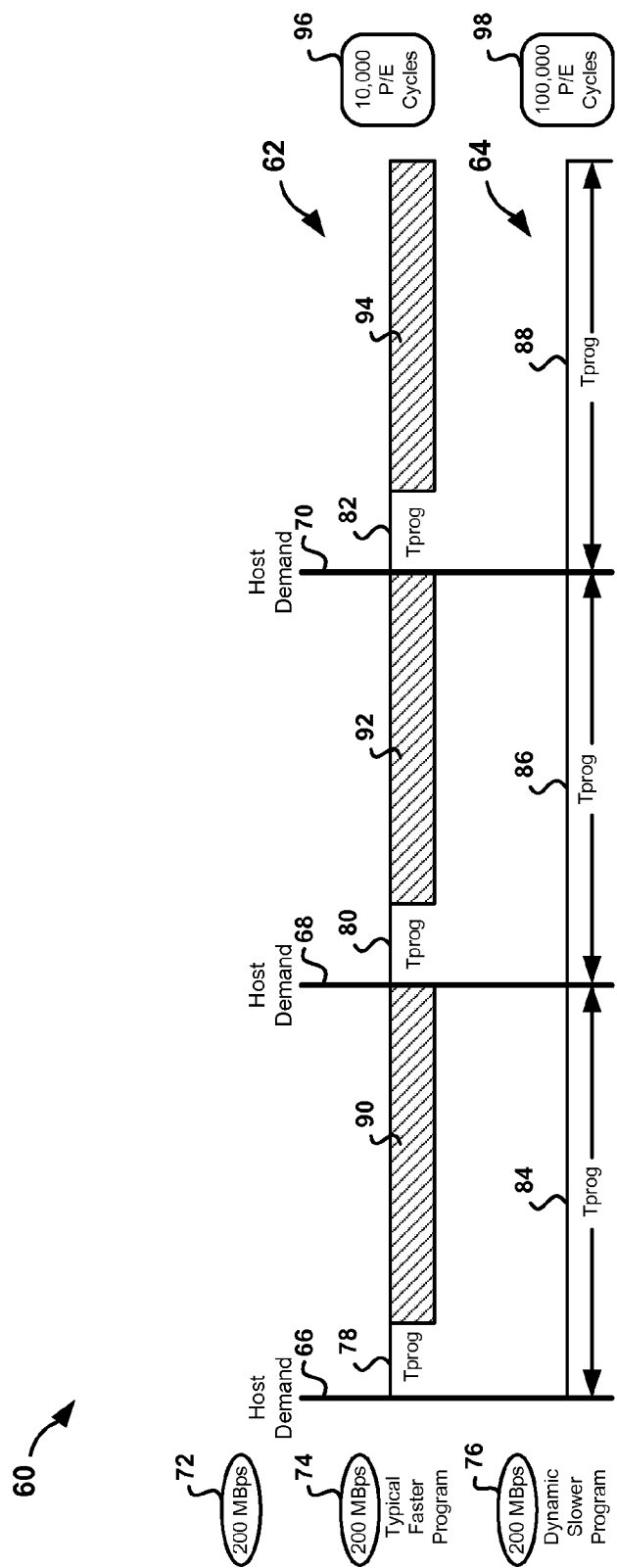
FIG. 3 is a timing diagram illustrating improvements in the endurance of a storage device that implements the dynamic write execution time control techniques according to one aspect of this disclosure in comparison to that of a conventional storage drive.

FIG. 3 is a timing diagram 60 illustrating improvements in endurance of an example storage device that implements the dynamic write execution time control techniques according to one aspect of this disclosure in comparison to that of a conventional storage drive. Timing diagram 60 includes axes 62, 64, host demand request indicators 66, 68, 70, rate bubbles 72, 74, 76, program operations 78, 80, 82, 84, 86, 88, idle time periods 90, 92, 94 and endurance boxes 96, 98.

Axes 62, 64 are timing axes that increase in time from left-to-right of timing diagram 60. In general, the same horizontal location on each of axes 62, 64 corresponds to the same instance of time. Axis 62 depicts program operations 78, 80, 82 performed by a conventional faster program-time storage drive, such as, e.g., a drive that includes high performance NAND flash devices. Axis 64 depicts program operations 84, 86, 88 performed by a dynamic storage drive implementing dynamic write execution time control techniques according to some aspects of this disclosure.

Host demand request indicators 66, 68, 70 depict the time at which the host device issues a new program operation request to the storage drives. The conventional storage drive performs program operations 78 in response to a program operation request indicated by host demand request indicator 66, program operation 80 in response to a program operation request indicated by host demand request indicator 68, and program operation 82 in response to a program operation request indicated by host demand request indicator 70. The dynamic storage drive performs program operation 84 in response to a program operation request indicated by host demand request indicator 66, program operation 86 in response to a program operation request indicated by host demand request indicator 68, and program operation 88 in response to a program operation request indicated by host demand request indicator 70.

The conventional storage drive may include a plurality of flash die each of which performs program operations at a rate of 30 megabytes per second (MB/sec) (e.g., 266 microseconds (μs) for each 8 kilobyte (KB) page). It should be noted that the rate at which each of the flash die performs a program operations may be an average rate because the individual program times may vary from operation to operation. The rate at which the flash die perform program operations may also be referred to as the throughput of the flash die. In this example, the conventional storage drive has a minimum of 32 die for capacity, throughput, redundancy and other reasons. Thus, the conventional storage drive performs program operations 78, 80, 82 at or near the throughput rate of 960 MB/sec (i.e., 30 MB/sec*32 die).

The conventional storage drive is not configured to dynamically adjust the write operation execution times of the flash die during operation of the drive. Thus, each of the flash die has a static or fixed write operation execution time (e.g., Tprog). Although the individual program times may vary slightly from operation to operation in the conventional storage drive, the target write operation execution time remains static. In other words, any variance in the write operation execution times for the conventional storage drive is the result of a statistical variance inherent in the write process itself rather than the deliberate manipulation of the write operation execution time.

The dynamic storage drive includes 32 flash die organized in a fashion similar to that of the conventional storage drive. However, the dynamic storage drive also includes a dynamic write timing control module 22 designed according to the techniques of this disclosure, which is capable of dynamically configuring the write operation execution times of each of the flash die within the dynamic storage drive. Thus, for the dynamic storage drive, each of the flash die has a dynamic write operation execution time (e.g., Tprog) that can be adjusted during normal operation of the drive.

In this example, the maximum host transfer rate for the system is 600 MB/sec, and the host device performs write operations at a 33% duty cycle. Thus, the conventional and dynamic storage drives, in this example, need only support a write throughput of 200 MB/sec, which may be referred to as the host demand for the system and is indicated by rate bubble 72.

The host demand, in this example, is almost 5 times slower than the throughput of the conventional drive operating at the static write operation execution time. However, the dynamic storage drive, in this example, is capable of dynamically adjusting the write operation execution time to track the host demand. Therefore, the dynamic storage drive sets the write operation execution time (i.e., Tprog) of the dynamic storage device to 1.28 milliseconds (ms) for program operations 84, 86, 88. In contrast, the write operation execution time for program operations 78, 80, 94 performed by the conventional storage drive is 1.28 milliseconds (ms).

As shown in FIG. 3, both the static and dynamic storage drives are able to meet the host demand throughput requirements of this example. Thus, the actual throughput of both devices is 200 MB/sec, which is indicated by rate bubbles 74 and 76. When the host demand is slower than the throughput of the conventional storage drive, there are several wasted idle time periods 90, 92, 94, which can create stress on the flash cells. However, according to the techniques in this disclosure, the dynamic storage drive adjusts the write operation execution time to track the relatively slow host demand and therefore uses a longer program time to minimize flash wear.

Consider the case where a slower write operation execution time (e.g., Tprog) produces the following endurance gain as shown in Table 1:

TABLE 1

Endurance Gain vs. Tprog

| Slower Tprog | Endurance Gain |
|---|---|
| 1.5x | 2x |
| 2x | 3x |
| 3x | 5x |
| 4x | 8x |
| 5x | 10x |

According to the example case shown in Table 1, a flash device that uses a write operation execution time that is 1.5 times slower than another flash device achieves a 2 times improvement in endurance over that which was achievable by the other flash device. Similarly, a flash device that uses a write operation execution time that is 2 times slower than another flash device achieves a 3 times improvement in endurance over that which was achievable by the other flash device. It should be noted that continuing to slow down the write operation may produce diminishing returns for the endurance gain.

In the example illustrated in FIG. 3, the dynamic storage drive is using a program operation execution time that is 5 times slower than that which is used by the conventional storage drive. Thus, by utilizing the time periods that would have been wasted idle time in a conventional flash device, the dynamic storage drive, in this example, produces a 10 times endurance gain (i.e., from 10 thousand (K) cycles to 100K cycles as depicted by endurance boxes 96 and 98). In this manner, the dynamic write operation execution timing control techniques of this disclosure may be used to improve the endurance of a storage drive while still meeting the throughput requirements of the host device.

Figure 4:
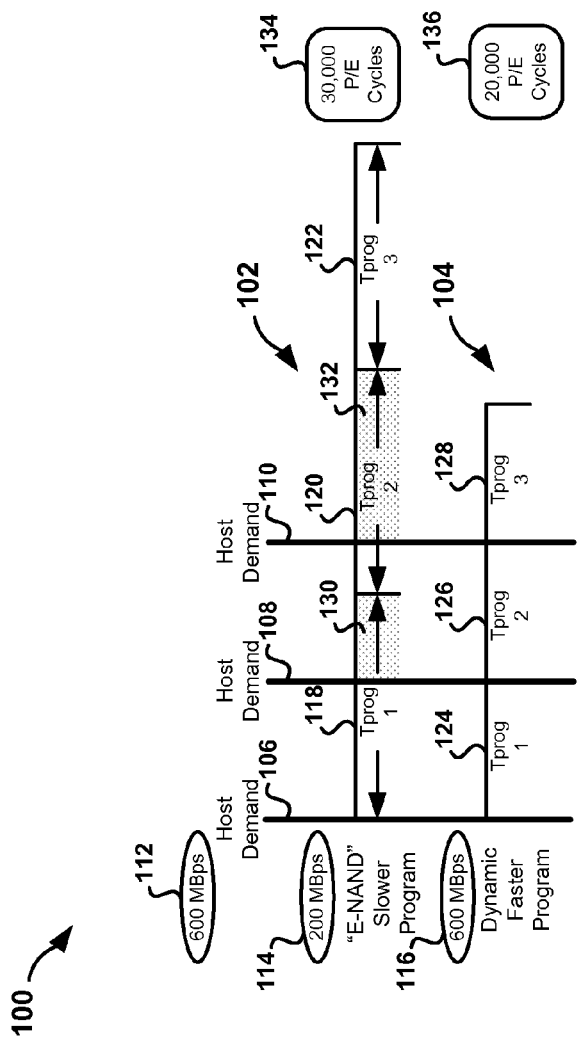
FIG. 4 is a timing diagram illustrating improvements in the throughput of a storage device that implements the dynamic write execution time control techniques according to one aspect of this disclosure in comparison to that of a conventional storage drive.

FIG. 4 is a timing diagram 100 illustrating improvements in throughput of an example storage device that implements the dynamic write execution time control techniques according to one aspect of this disclosure in comparison to that of a conventional storage drive. Timing diagram 100 includes axes 102, 104, host demand request indicators 106, 108, 110, rate bubbles 112, 114, 116, program operations 118, 120, 122, 124, 128, 130 throttled host performance time periods 130, 132 and endurance boxes 134, 136.

Axes 102, 104 are timing axes that increase in time from left-to-right of timing diagram 100. In general, the same horizontal location on each of axes 102, 104 corresponds to the same instance of time. Axis 102 depicts program operations 118, 120, 122 performed by a conventional slower program-time storage drive, such as, e.g., a storage drive that includes enterprise-NAND (E-NAND) flash devices. Axis 104 depicts program operations 124, 126, 128 performed by a dynamic storage drive implementing dynamic write execution time control techniques according to one aspect of this disclosure.

Host demand request indicators 106, 108, 110 depict the time at which the host device issues a new program operation request to the storage drives. The conventional storage drive performs program operation 118 in response to a program operation request indicated by host demand request indicator 106, program operation 120 in response to a program operation request indicated by host demand request indicator 108, and program operation 122 in response to a program operation request indicated by host demand request indicator 110. The dynamic storage drive performs program operation 124 in response to a program operation request indicated by host demand request indicator 106, program operation 126 in response to a program operation request indicated by host demand request indicator 68, and program operation 128 in response to a program operation request indicated by host demand request indicator 110.

The conventional storage drive may include a plurality of flash die each of which performs program operations at a rate 15 MB/sec (e.g. 532 µs/8 KB page). For example, the conventional storage drive may use E-NAND devices having a fixed Tprog time that is 2 times slower than that which was used for the conventional storage drive in FIG. 3. With a 32 die system, the conventional storage drive performs program operations 118, 120, 122 at or near a throughput rate of 480 MB/sec (i.e., 15 MB/sec*32 die).

Similar to the conventional storage drive described above with respect to FIG. 3, the conventional storage drive in FIG. 4 is also not configured to dynamically adjust the write operation execution times of the flash die during operation of the drive. Thus, each of the flash die has a static or fixed write operation execution time (e.g., Tprog).

The dynamic storage drive includes 32 flash die organized in a fashion similar to that of the conventional storage drive. The dynamic storage drive also includes a dynamic write timing control module 22 designed according to the techniques of this disclosure, which is capable of dynamically configuring the write operation execution times of each of the flash die within the dynamic storage drive. Thus, for the dynamic storage drive, each of the flash die has a dynamic write operation execution time (e.g., Tprog) that can be adjusted during normal operation of the drive.

In this example, the maximum host transfer rate for the system is 600 MB/sec. However, rather than performing write operations at a 33% duty cycle as described above with respect to FIG. 3, the host device performs such operations at the maximum rate of 600 MB/sec. Such a throughput rate may occur, for example, when the host device is performing a burst operation, or other high priority work. Thus, the conventional storage drive and the dynamic storage drive, in this example, need to support a write throughput of 600 MB/sec, which may be referred to as the host demand for the system and is indicated by rate bubble 112.

The host demand, in this example, is slower than the maximum throughput of the conventional drive operating at the static write operation execution time. Thus, as shown in FIG. 4, the conventional storage drive throttles host performance to 480 MB/sec. This is indicated by throttled host performance time periods 130, 132. However, the dynamic storage drive, in this example, is capable of dynamically adjusting the write operation execution time to track the host demand. Therefore, write timing control module 22 sets the write operation execution time (i.e., Tprog) to a time that is capable of providing throughput at a rate required by the host demand, and therefore maintains the required 600 MB/sec (e.g. 426 µs/8 KB page). In this manner, the write operation execution timing control techniques of this disclosure may be used to improve the ability of a storage device to satisfy host demand throughput requirements.

In addition, the dynamic storage drive is still operating at a rate that is 1.5 times slower than the typical Tprog rate of the high-performance NAND device in FIG. 3. Thus, the dynamic storage device, in this example, still produces a 2 times endurance gain in comparison to the high-performance NAND device of FIG. 3. Because the high-performance NAND device may have factory-determined write operation execution times, it may not be possible to select a conventional NAND device to precisely match the host demand. Moreover, the host demand may vary over time. Thus, for conventional NAND devices, a device needs to be selected that has a write execution time that has a higher throughput rate than the maximum host demand for the device. This can cause additional wear on the device. The dynamic storage drive in this example, however, does not need to operate above the minimum throughput rate required to satisfy host demand. Accordingly, the dynamic write operation execution timing control techniques of this disclosure may be used to improve the ability of a storage drive to satisfy host demand without necessarily producing the same endurance setbacks as that which would occur if using a high-performance NAND to satisfy the host demand.

In this example, the conventional storage drive (e.g., E-NAND device) operates at a rate that is 2 times slower than the high-performance NAND in FIG. 3. This produces a 3 times endurance gain, which is greater than the endurance gain of the dynamic storage drive as indicated by endurance boxes 134 and 136. However, in examples where the host demand comprises periods of high priority bursts and periods of idle time, write timing control module 22 may be able to detect the bursts periods and increase the write operation execution time during those periods to satisfy the host demand. Similarly, write timing control module 22 may be able to detect when the bursts period has ended (e.g., detect an idle time period) and decrease the write operation execution time during those periods to improve endurance. During such idle time periods, the conventional E-NAND device would experience a decrease in endurance. Therefore, although FIG. 4 shows that the dynamic storage device as having less endurance than that of the conventional storage drive, during periods of idle time (not shown in FIG. 4), the dynamic storage drive may, in some examples, be able to "make up" some or all of the endurance setback.

Figure 5:
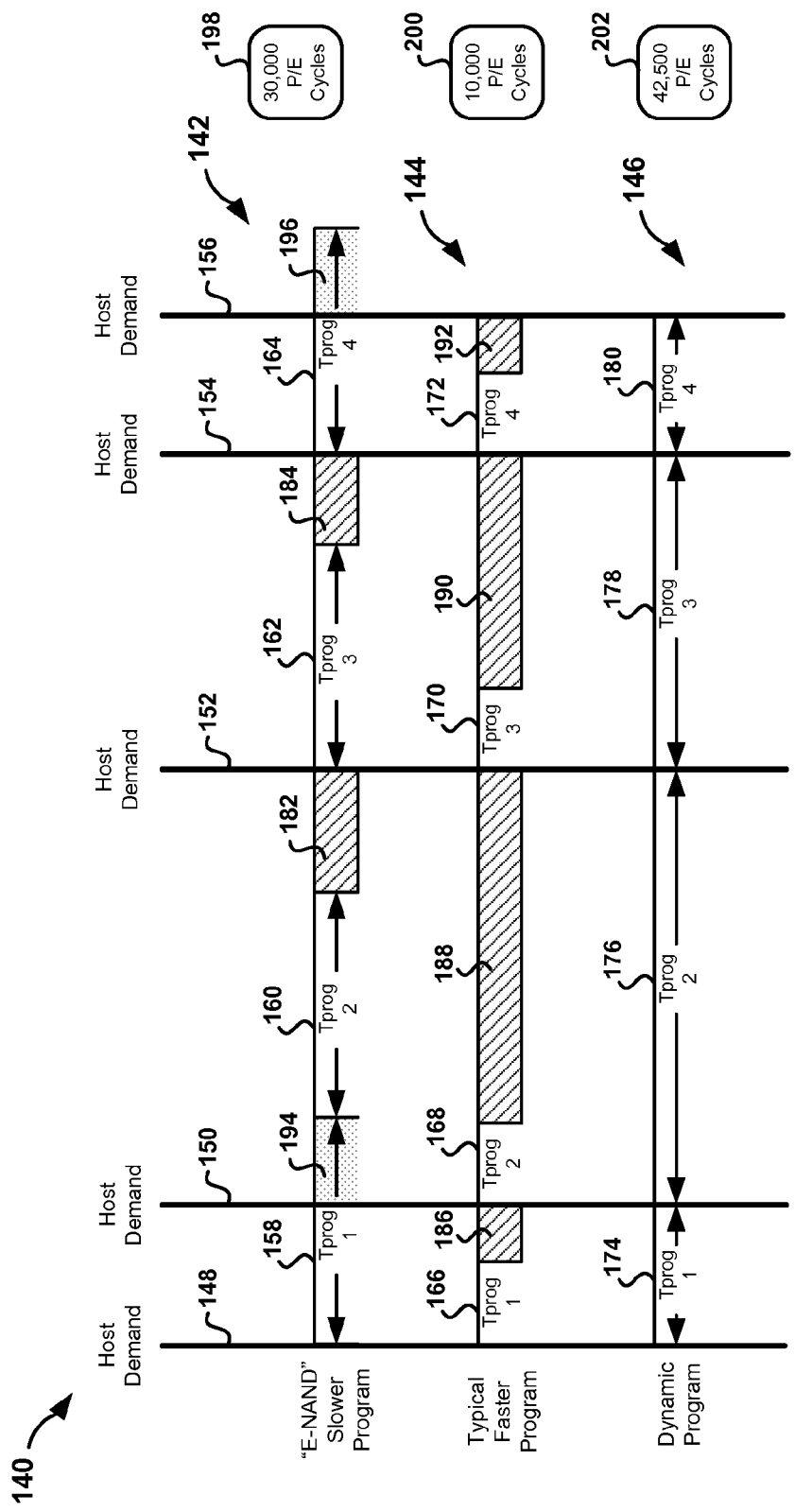
FIG. 5 is a timing diagram illustrating improvements in both the throughput and the endurance of a storage device that implements the dynamic write execution time control techniques according to one aspect of this disclosure in comparison to that which is achievable by two conventional storage drives.

FIG. 5 is a timing diagram 140 illustrating improvements in both throughput and endurance of an example storage device that implements the dynamic write execution time control techniques according to one aspect of this disclosure in comparison to that which is achievable by two conventional storage drives. Timing diagram 140 includes axes 142, 144, 146, host demand request indicators 148, 150, 152, 154, 156, program operations 158, 160, 162, 164, 166, 168, 170, 172, 174, 176, 178, 180, idle time periods 182, 184, 186, 188, 190, 192, throttled host performance time periods 194, 196 and endurance boxes 198, 200, 202.

Axes 142, 144, 146 are timing axes that increase in time from left-to-right of timing diagram 100. In general, the same horizontal location on each of axes 102, 104 corresponds to the same instance of time. Axis 142 depicts program operations 158, 160, 162, 164 performed by a conventional slower program-time storage drive, such as, e.g., the E-NAND storage drive described in FIG. 4. Axis 144 depicts program operations 166, 168, 170, 172 performed by a conventional fast program-time storage drive, such as, e.g., the high-performance NAND storage drive described in FIG. 3. Axis 146 depicts program operations 174, 176, 178, 180 performed by a dynamic storage drive implementing dynamic write execution time control techniques according to one aspect of this disclosure.

Host demand request indicators 148, 150, 152, 154 depict the time at which the host device issues a new program operation request to the storage drives. The conventional E-NAND storage drive performs program operations 158, 160, 162, 164 in response to program operation requests indicated, respectively, by host demand request indicators 148, 150, 152, 154. The conventional high-performance NAND storage drive performs program operations 166, 168, 170, 172 in response to program operation requests indicated, respectively, by host demand request indicators 148, 150, 152, 154. The dynamic storage drive performs operations 174, 176, 178, 180 in response to program operation requests indicated, respectively, by host demand request indicators 148, 150, 152, 154.

In this example, the host demand includes a mixture of relatively fast host demand and relatively slow host demand. In some types of applications, the typical storage drive operations will be the slower operations. Thus, when a typical high-performance NAND flash is used, endurance suffers. However, in some examples, it may not be known at the time of manufacture how slow is slow enough to still satisfy host demand, and how slow is too slow to satisfy host demand. This causes a difficulty when a drive manufacturer wishes to select an appropriate speed of E-NAND.

As shown in FIG. 5, the E-NAND storage drive is throttling host performance during bursts as indicated by throttled host performance time periods 194, 196. In addition, in the case of some slow host demand, the E-NAND storage drive is not actually slow enough to increase the endurance therefore generating idle time periods 182, 184. On the other hand, the typical high-performance NAND flash is too fast and is wasting lots of idle time, as indicated by idle time periods 186, 188, 190, 192, and therefore causing stress on the flash cells.

The dynamic storage drive designed according to the techniques of this disclosure, however, adjusts to the demand of the host system by either slowing down the program times to utilize the available idle time or by speeding up the program times to increase endurance. Such a system may be used to maximize endurance while not artificially throttling the host performance.

In this example shown in FIG. 5, the dynamic storage drive operates at a write operation execution time that is 1.5 times slower for operation 174 than that of the high-performance NAND device, 4 times slower for operation 176, 3 times slower for operation 178, and 1.5 times slower for operation 180. Thus, the dynamic storage drive was able to achieve endurance gain scaling of 2 times for program operation 174, 8 times for program operation 176, 5 times for program operation 178, and 2 times for program operation 180 for an average of 4.25 times gain over the entire workload. As indicated by endurance boxes 198 and 202, the dynamic storage drive produced more endurance than the conventional E-NAND system, while exceeding its performance. In addition, the dynamic storage drive successfully matched the performance of a typical fast high-performance NAND drive, while creating a substantial endurance gain. In this manner, the techniques in this disclosure may be used to improve the throughput and endurance of a storage drive in comparison to conventional high-speed and low-speed drives.

The calculations and metrics provided in the example timing diagrams in FIGS. 3-5 are provided for illustrative purposes. The scaling of the metrics in these examples was based on values observed, predicted and reported from different flash vendors. However, such metrics may or may not be representative of actual metrics used in flash devices. The techniques used in this disclosure may be used independently of any given set of timing metrics. Although the example timing diagrams illustrated in FIGS. 3-5 depict the dynamic adjustment of program operation execution times, it should be noted that such examples may apply, by analogy, to the dynamic adjustment of erase operation execution times.

The techniques illustrated in FIGS. 6-23 are described with respect to various modules within storage drive 10 of FIG. 1 for exemplary purposes. It should be noted, however, that where specific modules are described as performing certain actions, in other examples, such actions may be performed by different modules or be performed generally by a processor or controller, e.g., controller 12. It should also be noted that the techniques illustrated in FIG. 6-23 are not limited to implementation within a single controller, but may be implemented as part of multiple controllers or processors as well as in multiple devices. In addition, although the techniques in FIGS. 6-23 describe techniques for the dynamic adjustment of write operation execution times for a storage device, similar techniques may be used to dynamically adjust read operation execution times for a storage device and are within the scope of this disclosure.

Figure 6:
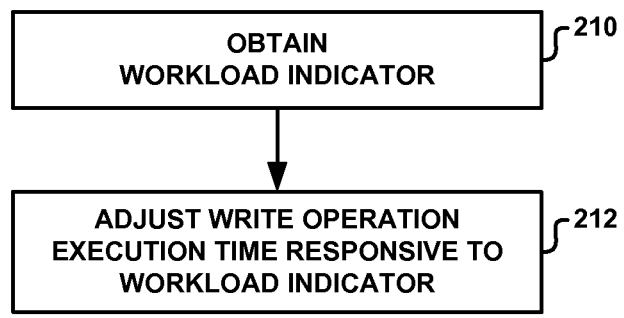
FIG. 6 is a flow diagram illustrating an example technique for controlling a write operation execution time responsive to a workload indicator according to one aspect of the disclosure.

FIG. 6 is a flow diagram illustrating an example technique for adjusting a write operation execution time responsive to a workload indicator according to one aspect of the disclosure. Write timing control module 22 obtains a workload indicator (210). In some examples, the workload indicator may be host demand indicator. In additional examples, the workload indicator may be a resource utilization indicator.

Write timing control module 22 adjusts a write operation execution time responsive to the workload indicator (212). In some examples, the write operation execution time may be a program operation execution time. In additional examples, the write operation execution time may be an erase operation execution time.

In some examples, write timing control module 22 may configure a write operation timing parameter in one or more storage devices in order to adjust the write operation execution time. For example, write timing control module 22 may increase or decrease the voltage level or amplitude for programming pulses and/or erase pulses. In additional examples, write timing control module 22 may increase or decrease the pulse width or duration for programming pulses and/or erase pulses. In further examples, write timing control module 22 may increase or decrease the number of pulses used within a sequence of programming and/or erase pulses.

Figure 7:
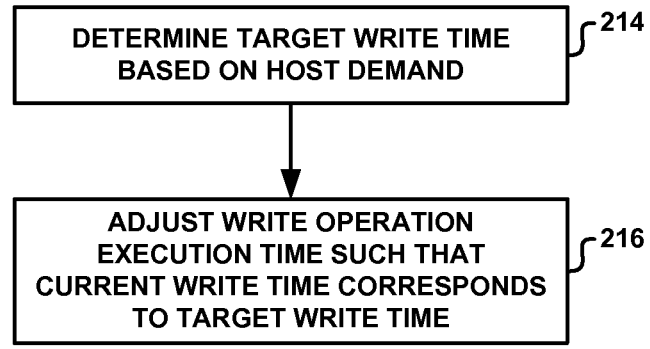
FIG. 7 is a flow diagram illustrating an example technique for adjusting a write operation execution time responsive to a host demand indicator according to one aspect of the disclosure.

FIG. 7 is a flow diagram illustrating an example technique for adjusting a write operation execution time responsive to a host demand indicator according to one aspect of the disclosure. The technique illustrated in FIG. 7 may correspond, in some examples, to process box 212 in FIG. 6.

Write timing control module 22 determines a target write time based on the host demand (214). The host demand may be indicated by a host demand indicator as described herein. In some examples, write timing control module 22 may calculate the target write time such that throughput of the storage drive is high enough to meet the host demand. Write timing control module 22 adjust the write operation execution time such that the current write time corresponds to the target write time (216). The current write time, as used herein, may refer to the write time at which one or more storage devices in the drive operate when using the current parameter settings.

Figure 8:
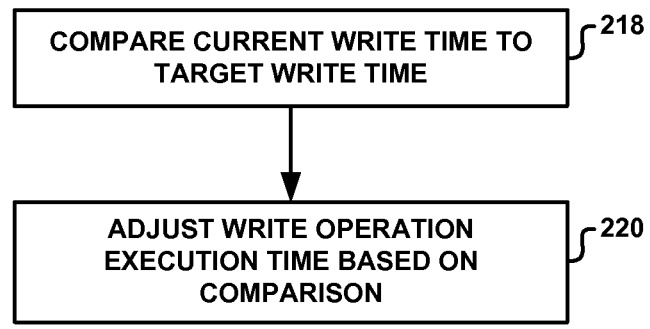
FIG. 8 is a flow diagram illustrating an example technique for adjusting a write operation execution time responsive to a host demand indicator according to one aspect of the disclosure.

FIG. 8 is a flow diagram illustrating an example technique for adjusting a write operation execution time responsive to a host demand indicator according to one aspect of the disclosure. The technique illustrated in FIG. 8 may correspond, in some examples, to process box 216 in FIG. 7. Write timing control module 22 compares the current write time to the target write time (218). Write timing control module 22 adjusts the write operation execution time based on the comparison (220).

Figure 9:
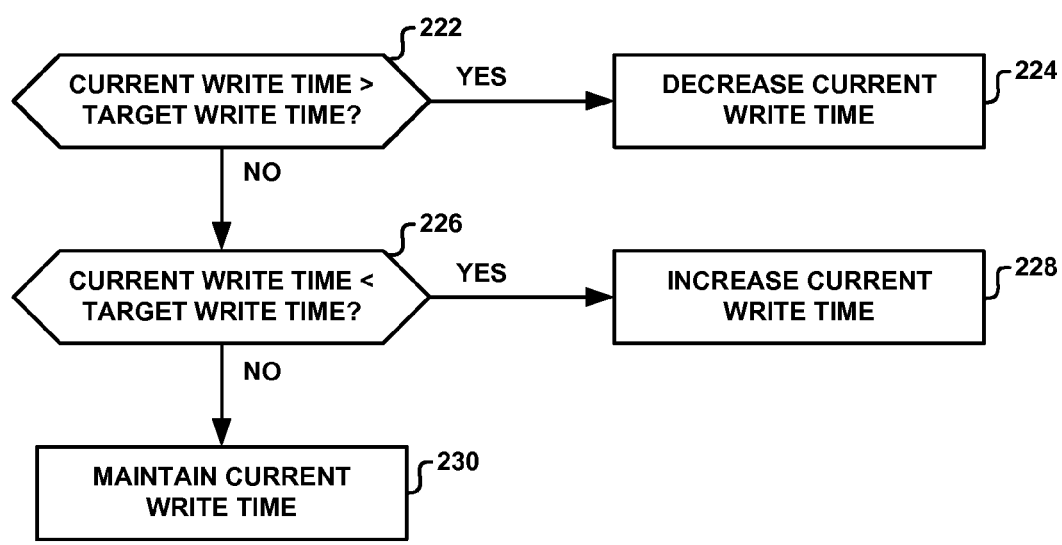
FIG. 9 is a flow diagram illustrating an example technique for adjusting a write operation execution time responsive to a host demand indicator according to one aspect of the disclosure.

FIG. 9 is a flow diagram illustrating an example technique for adjusting a write operation execution time responsive to a host demand indicator according to one aspect of the disclosure. The technique illustrated in FIG. 9 may correspond, in some examples, to process boxes 218 and 220 in FIG. 8.

Write timing control module 22 determines if the current write time is greater than the target write time (222). If the current write time is greater than the target write time, write timing control module 22 decreases the current write time (224). If the current write time is not greater than the target write time, write timing control module 22 determines if the current write time is less than the target write time (226). If the current write time is less than the target write time, write timing control module 22 increases the current write time (228). If the current write time is not less than the target write time, write timing control module 22 maintains the current write time (230).

Figure 10:
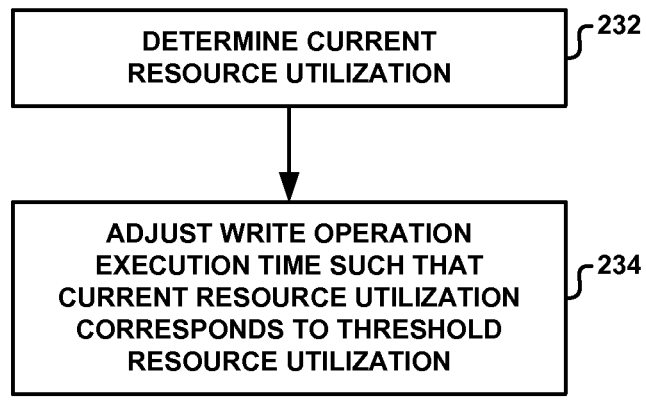
FIG. 10 is a flow diagram illustrating an example technique for adjusting a write operation execution time responsive to a resource utilization indicator according to one aspect of the disclosure.

FIG. 10 is a flow diagram illustrating an example technique for adjusting a write operation execution time responsive to a resource utilization indicator according to one aspect of the disclosure. The technique illustrated in FIG. 10 may correspond, in some examples, to process box 212 in FIG. 6. Write timing control module 22 determines a current resource utilization based on the workload indicator (232). Write timing control module 22 adjusts the write operation execution time such that the current resource utilization corresponds to a threshold resource utilization (234). The threshold resource utilization may be based on a target queue saturation level.

Figure 11:
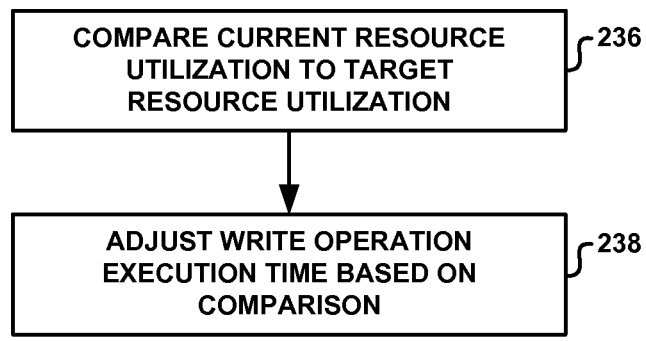
FIG. 11 is a flow diagram illustrating an example technique for adjusting a write operation execution time responsive to a resource utilization indicator according to one aspect of the disclosure.

FIG. 11 is a flow diagram illustrating an example technique for adjusting a write operation execution time responsive to a resource utilization indicator according to one aspect of the disclosure. The technique illustrated in FIG. 11 may correspond, in some examples, to process box 234 in FIG. 10. Write timing control module 22 compares a current resource utilization level to the target resource utilization level (236). Write timing control module 22 adjusts a write operation execution time based on the comparison (238).

Figure 12:
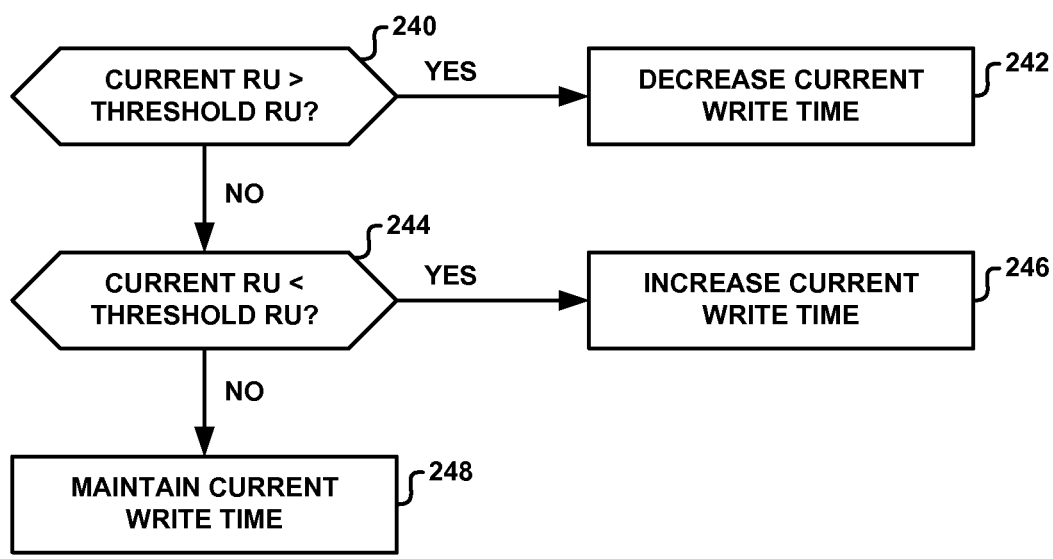
FIG. 12 is a flow diagram illustrating an example technique for adjusting a write operation execution time responsive to a resource utilization indicator according to one aspect of the disclosure.

FIG. 12 is a flow diagram illustrating an example technique for adjusting a write operation execution time responsive to a resource utilization indicator according to one aspect of the disclosure. The technique illustrated in FIG. 11 may correspond, in some examples, to process boxes 246 and 238 in FIG. 11.

Write timing control module 22 determines if the current resource utilization level is greater than the threshold resource utilization level (240). If the current resource utilization level is greater than the threshold resource utilization level, write timing control module 22 decreases the current write time (242).

If the current resource utilization level is not greater than the threshold resource utilization level, write timing control module 22 determines if the current resource utilization level is less than the threshold resource utilization level (244). If the current resource utilization level is less than the threshold resource utilization level, write timing control module 22 increases the current write time (246). If the current resource utilization level is not less than the threshold resource utilization level, write timing control module 22 maintains the current write time (248).

Figure 13:
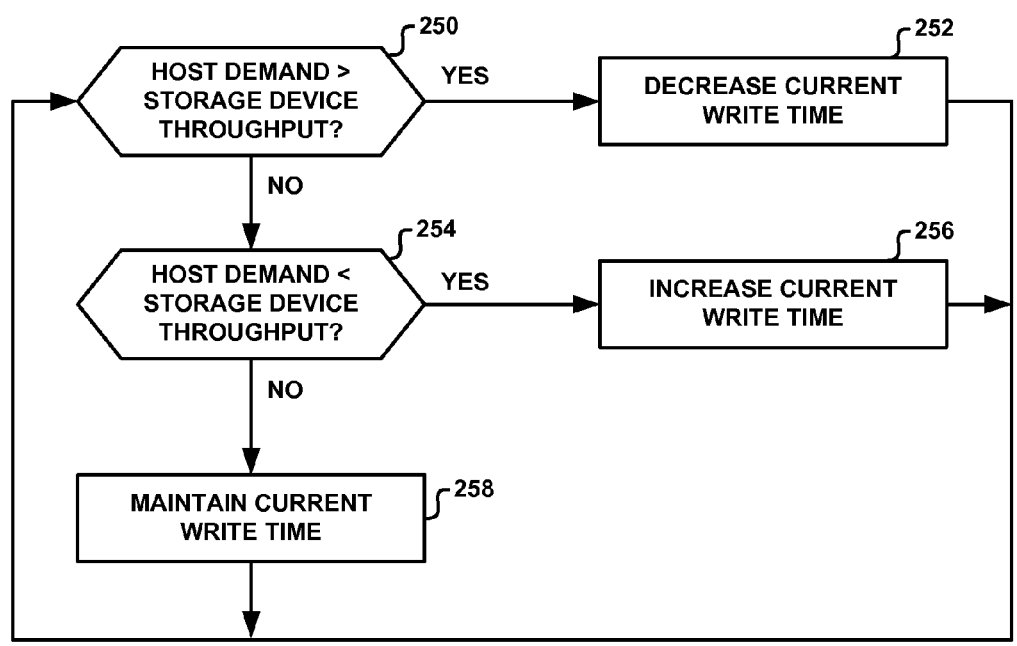
FIG. 13 is a flow diagram illustrating an example technique for adjusting a write operation execution time to track host demand according to one aspect of the disclosure.

FIG. 13 is a flow diagram illustrating an example technique for adjusting a write operation execution time to track host demand according to one aspect of the disclosure. The technique illustrated in FIG. 11 may correspond, in some examples, to process box 212 in FIG. 6.

Write timing control module 22 determines if the host demand is greater than the storage device throughput (344). Write timing control module 22 may use the host demand indicator to make this determination. If the host demand is greater than the current storage device throughput, write timing control module 22 decreases the current write time (252). Write timing control module 22 returns to decision block 250.

If the host demand is not greater than the storage device throughput, write timing control module 22 determines if the host demand is less than the current storage device throughput (254). If the host demand is less than the current storage device throughput, write timing control module 22 increases the current write time (256). Write timing control module 22 returns to decision block 250. If the host demand is not less than the current storage device throughput, write timing control module 22 maintains the current write time (258). Write timing control module 22 returns to decision block 250.

Figure 14:
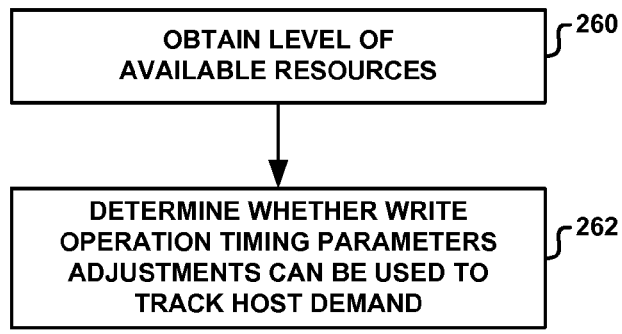
FIG. 14 is a flow diagram illustrating an example technique for determining whether a write operation execution time adjustment can be used to track host demand according to one aspect of the disclosure.

FIG. 14 is a flow diagram illustrating an example technique for determining whether a write operation execution time adjustment can be used to track host demand according to one aspect of the disclosure. Write timing control module 22 obtains a level of available resources (260). In some examples, write timing control module 22 may use the resource utilization indicator to obtain the level of available resources. Write timing control module 22 determines whether write operation execution time adjustments can be used to track host demand based on the level of resource utilization (262).

Figure 15:
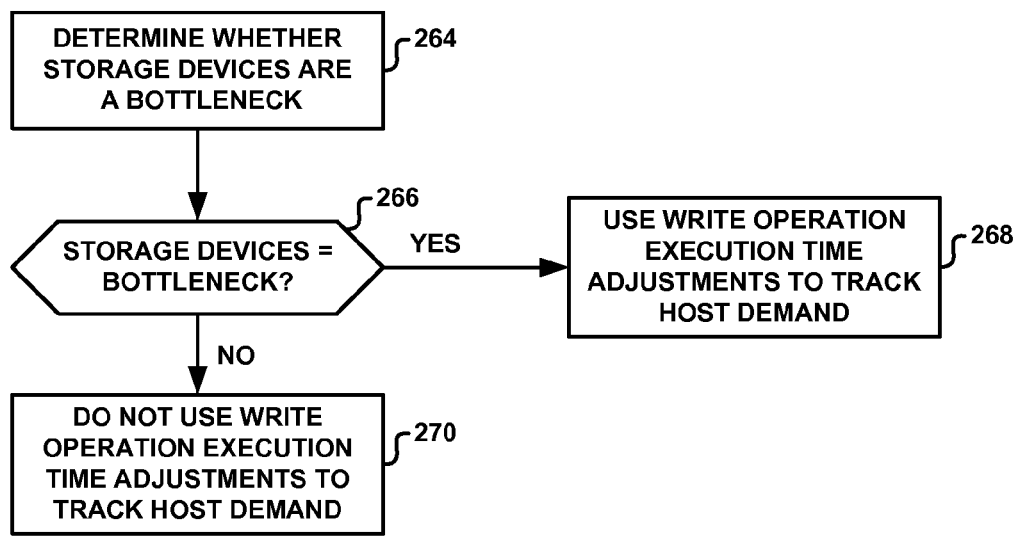
FIG. 15 is a flow diagram illustrating an example technique for determining whether a write operation execution time adjustment can be used to track host demand according to one aspect of the disclosure.

FIG. 15 is a flow diagram illustrating an example technique for determining whether a write operation execution time can be used to track host demand according to one aspect of the disclosure. The technique illustrated in FIG. 11 may correspond, in some examples, to process boxes 260 and 262 in FIG. 14.

Write timing control module 22 determines whether the storage devices are a throughput bottleneck within the storage drive (264). If the storage devices are a throughput bottleneck within the storage drive, write timing control module 22 determines to use write operation execution time adjustments to track host demand (268). In some examples, write timing control module 22 may use the technique illustrated in FIG. 13 to track host demand.

If the storage devices are not a throughput bottleneck within the storage drive, write timing control module 22 determines not to use write operation execution time adjustments to track host demand (270).

Figure 16:
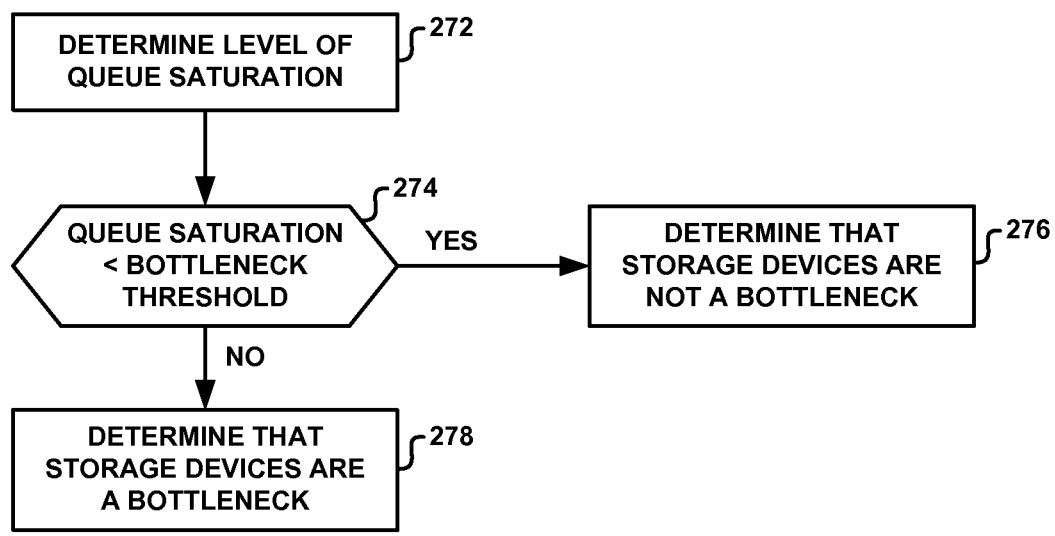
FIG. 16 is a flow diagram illustrating an example technique for determining whether storage devices are a throughput bottleneck according to one aspect of the disclosure.

FIG. 16 is a flow diagram illustrating an example technique for determining whether storage devices are a throughput bottleneck according to one aspect of the disclosure. The technique illustrated in FIG. 16 may correspond, in some examples, to process box 264 in FIG. 15.

Write timing control module 22 determines a current level of queue saturation (272). Write timing control module 22 determines if the current level of queue saturation is less than a bottleneck threshold (274). If the current level of queue saturation is less than a bottleneck threshold, write timing control module 22 determines that the storage devices are not a throughput bottleneck within the storage drive (276). Otherwise, if the current level of queue saturation is not less than a bottleneck threshold, write timing control module 22 determines that the storage devices are a throughput bottleneck (278).

Figure 17:
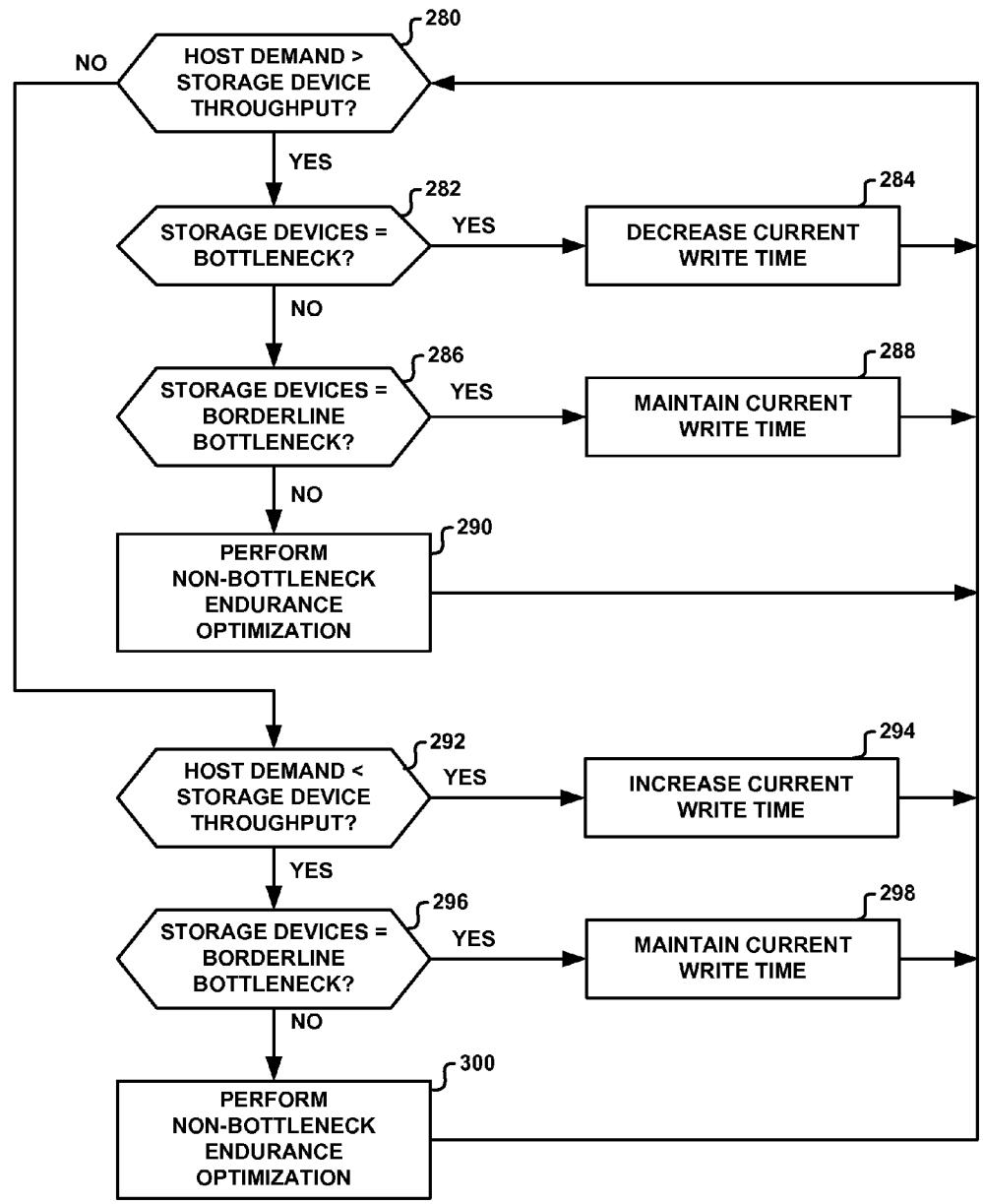
FIG. 17 is a flow diagram illustrating an example technique for tracking host demand with a non-bottleneck endurance optimization routine according to one aspect of the disclosure.

FIG. 17 is a flow diagram illustrating an example technique for tracking host demand with non-bottleneck endurance optimization according to one aspect of the disclosure. Write timing control module 22 determines if the host demand is greater than the current storage device throughput (280). If the host demand is not greater than the current storage device throughput, write timing control module 22 proceeds to decision box 292. If the host demand is greater than the current storage device throughput, write timing control module 22 determines if the storage devices are a throughput bottleneck for the storage drive (282). If the storage devices are a throughput bottleneck for the storage drive, write timing control module 22 decreases the current write time (284). Write timing control module 22 proceeds to decision box 280.

If the storage devices are not a throughput bottleneck for the storage drive, write timing control module 22 determines if the storage devices are within a certain tolerance range of being in a bottleneck condition, hereinafter referred to as a "borderline bottleneck condition." If the storage devices are in a borderline bottleneck condition, write timing control module 22 maintains the current write time (288). If the storage devices are not in a borderline bottleneck condition, write timing control module 22 performs a non-bottleneck endurance optimization algorithm (290), an example of which is illustrated win FIG. 18. Write timing control module 22 proceeds to decision box 280.

At decision box 280, if the host demand is not greater than the current storage device throughput, write timing control module 22 determines if the host demand is less than the current storage device throughput (292). If the host demand is less than the current storage device throughput, write timing control module 22 increases the current write time (294). Write timing control module 22 proceeds to decision box 280.

If the host demand is not less than the current storage device throughput, write timing control module 22 determines if the storage devices are in a border line bottleneck condition (296). If the storage devices are in a border line bottleneck condition, write timing control module 22 maintains the current write time (298). Write timing control module 22 proceeds to decision box 280. If the storage devices are not in a border line bottleneck condition, write timing control module 22 performs a non-bottleneck endurance optimization algorithm (300), an example of which is illustrated win FIG. 18. Write timing control module 22 proceeds to decision box 280.

Figure 18:
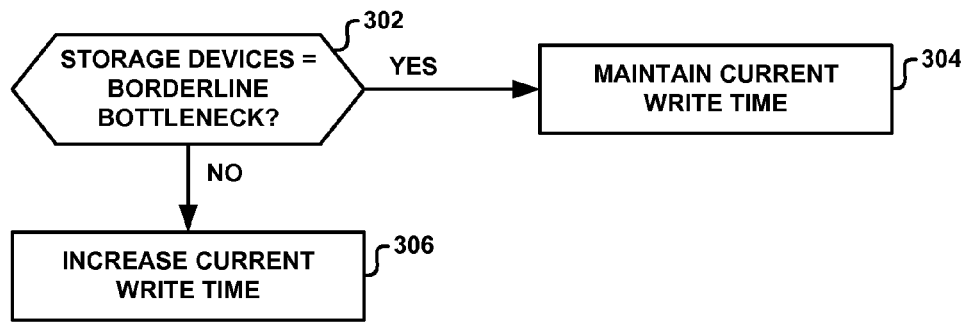
FIG. 18 is a flow diagram illustrating an example technique for non-bottleneck endurance optimization according to one aspect of the disclosure.

FIG. 18 is a flow diagram illustrating an example technique for bottleneck endurance optimization according to one aspect of the disclosure. The technique illustrated in FIG. 18 may correspond, in some examples, to one or both of process boxes 290 and 300 in FIG. 17. Write timing control module 22 determines if the storage devices are in a borderline bottleneck condition (302). If the storage devices are in a borderline bottleneck condition, writing control module 22 maintains the current write time (304). If the storage devices are not in a borderline bottleneck condition, writing control module 22, write timing control module 22 increases the current write time (306).

Figure 19:
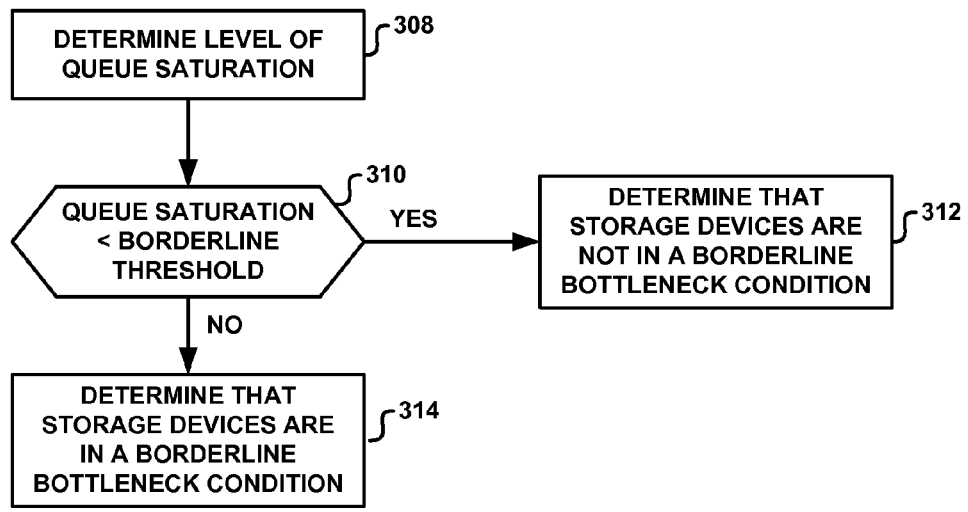
FIG. 19 is a flow diagram illustrating an example technique for determining if the storage devices satisfy a borderline bottleneck condition according to one aspect of the disclosure.

FIG. 19 is a flow diagram illustrating an example technique for determining if the storage devices satisfy a borderline bottleneck condition according to one aspect of the disclosure. The technique illustrated in FIG. 19 may correspond, in some examples, to one or more of decision boxes 286 and 296 in FIG. 17 and decision box 302 in FIG. 18.

Write timing control module 22 determines a level of queue saturation (308). Write timing control module 22 determines if the level of queue saturation is less than a borderline threshold (310). If the level of queue saturation is less than a borderline threshold, write timing control module 22 determines that the storage devices are not in a borderline bottleneck condition (312). If the level of queue saturation is not less than a borderline threshold, write timing control module 22, determines that the storage devices are in a borderline bottleneck condition (314). In some examples, the borderline threshold may be less than the bottleneck threshold.

Figure 20:
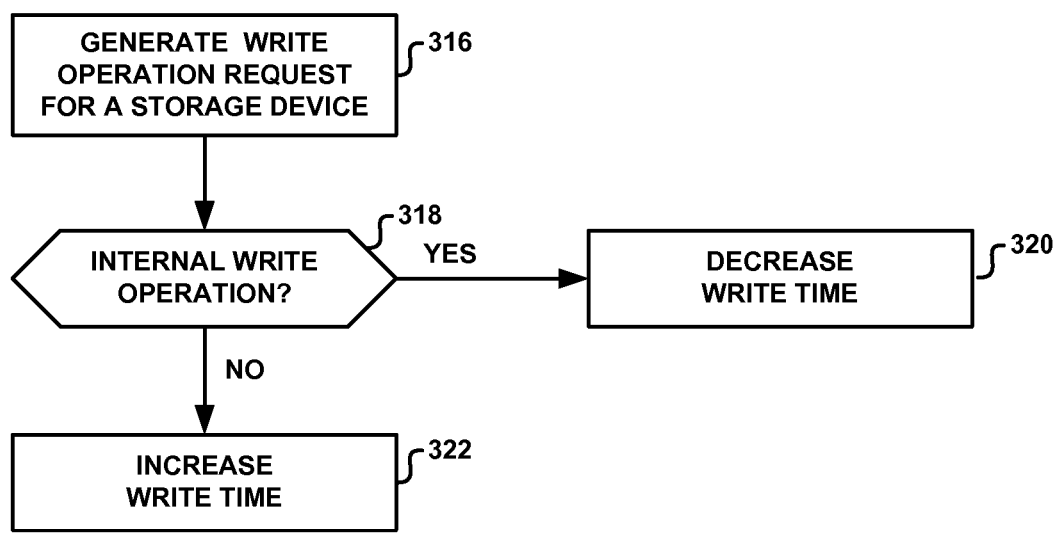
FIG. 20 is a flow diagram illustrating an example technique for adjusting a write operation execution time based on the type of write operation being processed according to one aspect of this disclosure.

FIG. 20 is a flow diagram illustrating an example technique for adjusting a write operation execution time based on a type of write operation according to one aspect of this disclosure. Write timing control module 22 generates a write operation request for a storage device (316). Write timing control module 22 determines if the write operation is an internal write operation or an external write operation (318). If the write operation is an internal write operation, write timing control module 22 decreases the write time for the operation (320). If the write operation is not an internal write operation (i.e., an external operation), write timing control module 22 increases the write time for the operation (320). Internal operations may include, for example, metadata operations and garbage collection operations. External operations may include, for example, operations executed in order to read user data from or write user data to a storage device in response to a host command.

The technique illustrated in FIG. 20 may correspond, in some examples, to process box 212 in FIG. 6. Thus, in some examples, the workload indicator may also be indicative of a type of operation (e.g., an internal vs. external operation).

Figure 21:
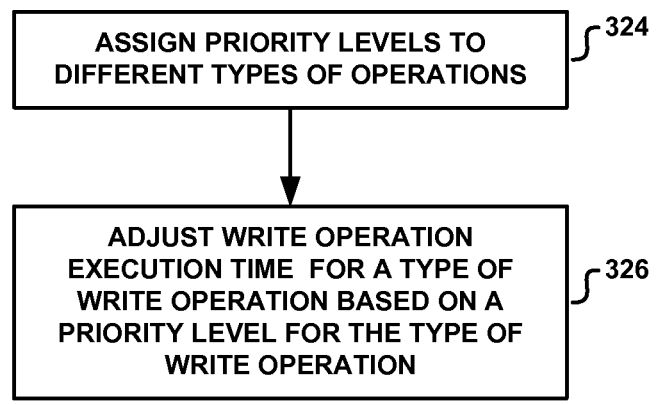
FIG. 21 is a flow diagram illustrating an example technique for adjusting a write operation execution time for a type of write operation based on a priority level assigned to the type of write operation.

FIG. 21 is a flow diagram illustrating an example technique for adjusting a write operation execution time for a type of write operation based on a priority level assigned to the type of write operations. Write timing control module 22 assigns a priority level to each different type of operation in a set of operation types (324). Write timing control module 22 adjusts a write operation execution time for the operation based on a priority level for the type of write operation (326). In some examples, the operation types may be user data operations, metadata operations, and garbage collection operations.

The technique illustrated in FIG. 21 may correspond, in some examples, to process box 212 in FIG. 6. Thus, in some examples, the workload indicator may also be indicative of a type of operation (e.g., user data, metadata, garbage collection).

Figure 22:
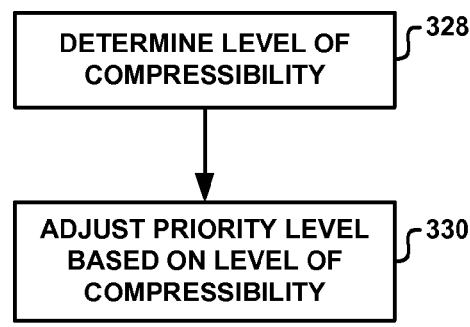
FIG. 22 is a flow diagram illustrating an example technique for adjusting a priority level for a type of write operation based on compressibility of the data according to one aspect of this disclosure.

FIG. 22 is a flow diagram illustrating an example technique for adjusting a priority level for a type of write operation based on compressibility of the data according to one aspect of this disclosure. Write timing control module 22 determines a level of compressibility of the data (324). Write timing control module 22 adjusts a write operation execution time for a user data operation based on the level of compressibility of the user data (328).

The level of compressibility, as used herein, may refer to the amount of reduction in the size of the data after running through a compression algorithm. In some examples, the level of compressibility may be denoted as a ratio between the compressed size of the data to the non-compressed size of the data. For example, a sector of data having a non-compressed size of 512 bytes may be compressed to a compressed size of 256 bytes to form a compressed sector. In such a sector, the level of compressibility may, in some examples, be the ratio of 512 bytes to 256 bytes (i.e., a level of compressibility of 2). In this example, another sector of data having a non-compressed size of 512 bytes may compress to a compressed size of only 500 bytes. In such a sector, the level of compressibility may, in some examples, be the ratio of 512 bytes to 500 bytes (i.e., a level of compressibility of 1.024). Thus, the level of compressibility of the first sector (i.e., the sector having the compressed size of 256 bytes) is greater than the level of compressibility of the second sector (i.e., the sector having the compressed size of 500 bytes).

The technique illustrated in FIG. 22 may correspond, in some examples, to process box 212 in FIG. 6. Thus, in some examples, the workload indicator may also be indicative of a level of compressibility of the data.

Figure 23:
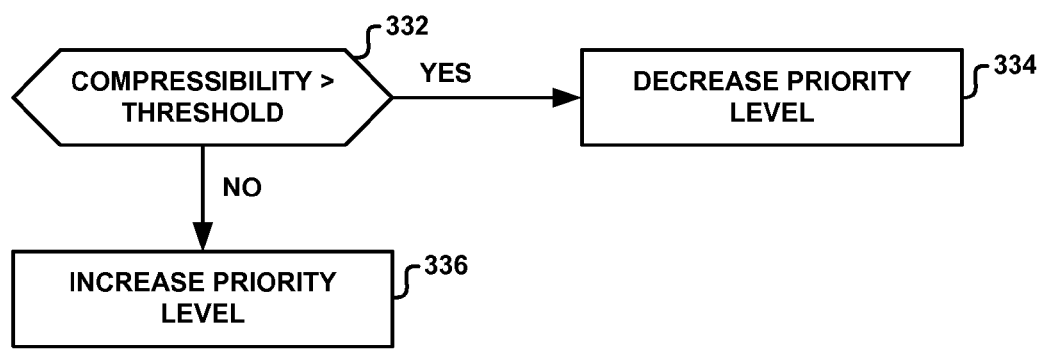
FIG. 23 is a flow diagram illustrating an example technique for adjusting a priority level for a type of write operation based on compressibility of the data according to one aspect of this disclosure.

FIG. 23 is a flow diagram illustrating an example technique for adjusting a priority level for a type of write operation based on compressibility of the data according to one aspect of this disclosure. The technique illustrated in FIG. 23 may correspond, in some examples, to process box 330 in FIG. 22.

Write timing control module 22 determines if the compressibility of the user data is greater than a threshold level of compressibility (332). If the compressibility of the user data is greater than a threshold level of compressibility, write timing control module 22 decreases the priority level of the user data operation (334). If the compressibility of the user data is not greater than a threshold level of compressibility, write timing control module 22 increases the priority level of the user data operation (336).

It should be noted that this disclosure may refer, in some examples, to the adjustment of program operation execution times, and in other examples, to the adjustment of erase operation execution times. Such examples are made for exemplary purposes and to show the benefits of using slower operations to increase endurance, and faster operations to increase throughput performance. The examples are not intended to limit the disclosure to any particular type of write operation. Rather, the techniques in this disclosure may apply to all types of write operations.

In some examples, the control of the erase and program times may be independent from each other. For example, the dynamic write operation execution control techniques may only slow down the erase operation, such as, e.g., during a garbage collection operation. As another example, the dynamic write operation execution control techniques may only speed up the program execution time. In some examples, both program and erase time affect endurance and throughput performance, but to different degrees.

The dynamic adjustment of write operation execution times described in this disclosure does not necessarily require the immediate change of a program time for each individual flash program, but may be representative over a usage time sample of the device. The techniques in this disclosure may be used, in some examples, to exploit the knowledge of the demand to increase endurance and still satisfy the throughput performance expected by the host device.

In some examples, the flash workload may be indicative of the number of host writes. In additional examples, the flash workload may be indicative of a total flash workload that includes host writes, garbage collection and metadata operations. In such examples, the host demand indicator may be indicative, in some examples, of the total flash workload. In such examples, the write operation timing control techniques of this disclosure may generate a total workload metric based combination of different types of flash operations with different weights applied to each operation for priority.

In additional examples, the total demand of the system may be a combination of the different types of operations, with a priority level for each type of operation. In such examples, the demand for garbage collection may, in some examples, be set to a lower priority than that of the host data writes in order to use a slower program time to reduce wear during garbage collection.

In further examples, the priority for a particular operation may change over time. For example, for a given host write demand, the write operation timing control techniques may determine, in some examples, that the data is highly compressible. In such a case, because there is not as much flash write demand for that workload, the write operation timing control techniques may assign the host write data operation to a lower priority.

In some examples, the techniques in this disclosure may improve the reliability of the storage device. For example, less error recovery may be required on subsequent operations.

Although this disclosure describes techniques for dynamically adjusting the operation execution time for any type of storage device operation (e.g., read, write, program, and erase operations), the examples in this disclosure are described primarily with respect to the dynamic adjustment of operation execution times for write operations (e.g., program and erase operations). It is recognized, however, that similar examples designed to dynamically adjust a read operation execution time are also contemplated and within the scope of this disclosure.

For example, read operations may impact the wear on a flash storage device in a manner similar to that which was described above with respect to write operations. In such examples, the read operations execution time for a storage device may be adjusted in response to a workload indicator in a manner similar to that which is described above with respect to the write operations. In some examples, the storage device may include one or more read operation timing parameters that can be configured to adjust the read operation execution time of the storage device.

The techniques described in this disclosure may be implemented within one or more of a general purpose microprocessor, digital signal processor (DSP), application specific integrated circuit (ASIC), field programmable gate array (FPGA), programmable logic devices (PLDs), or other equivalent logic devices. Accordingly, the terms "processor" or "controller," as used herein, may refer to any one or more of the foregoing structures or any other structure suitable for implementation of the techniques described herein.

The various components illustrated herein may be realized by any suitable combination of hardware, software, firmware, or any combination thereof. In the figures, various components are depicted as separate units or modules. However, all or several of the various components described with reference to these figures may be integrated into combined units or modules within common hardware, firmware, and/or software. Accordingly, the representation of features as components, units or modules is intended to highlight particular functional features for ease of illustration, and does not necessarily require realization of such features by separate hardware, firmware, or software components. In some cases, various units may be implemented as programmable processes performed by one or more processors.

Any features described herein as modules, devices, or components may be implemented together in an integrated logic device or separately as discrete but interoperable logic devices. In various aspects, such components may be formed at least in part as one or more integrated circuit devices, which may be referred to collectively as an integrated circuit device, such as an integrated circuit chip or chipset. Such circuitry may be provided in a single integrated circuit chip device or in multiple, interoperable integrated circuit chip devices, and may be used in any of a variety of image, display, audio, or other multi-media applications and devices. In some aspects, for example, such components may form part of a mobile device, such as a wireless communication device handset.

If implemented in software, the techniques may be realized at least in part by a computer-readable data storage medium comprising code with instructions that, when executed by one or more processors, performs one or more of the methods described above. The computer-readable storage medium may form part of a computer program product, which may include packaging materials. The computer-readable storage medium may comprise random access memory (RAM) such as synchronous dynamic random access memory (SDRAM), read-only memory (ROM), non-volatile random access memory (NVRAM), electrically erasable programmable read-only memory (EEPROM), embedded dynamic random access memory (eDRAM), static random access memory (SRAM), flash memory, magnetic or optical data storage media. Any software that is utilized may be executed by one or more processors, such as one or more DSP's, general purpose microprocessors, ASIC's, FPGA's, or other equivalent integrated or discrete logic circuitry.

The implementations described above and other implementations are within the scope of the following claims.

The invention claimed is:

1. A method comprising:
   obtaining, via a controller of a storage drive, a workload indicator; and
   reducing wear for a solid state storage device of the storage drive by adjusting, via the controller, an operation execution speed for the solid state storage device responsive to at least the workload indicator, wherein adjusting the operation execution speed comprises adjusting a write operation timing parameter.

2. The method of claim 1, wherein the workload indicator comprises a host demand indicator.

3. The method of claim 1, wherein the workload indicator comprises a resource utilization indicator.

4. The method of claim 1, wherein the write operation timing parameter comprises a program operation timing parameter.

5. The method of claim 1, wherein the write operation timing parameter comprises an erase operation timing parameter.

6. The method of claim 1, wherein the write operation timing parameter comprises a voltage level parameter defining an amplitude for at least one of a programming voltage pulse and an erase voltage pulse.

7. The method of claim 1, wherein the write operation timing parameter comprises a pulse duration parameter defining a pulse duration for at least one of a programming voltage pulse and an erase voltage pulse.

8. The method of claim 1, wherein the write operation timing parameter comprises a number of pulses parameter defining at least one of a number of programming pulses used in a programming pulse sequence and a number of erase pulses used in an erase pulse sequence.

9. The method of claim 1, wherein the workload indicator is obtained from a device external to the storage drive.

10. The method of claim 1, wherein the solid state storage device comprises a NAND flash storage device.

11. The method of claim 1, wherein adjusting the operation execution speed for a solid state storage device responsive to at least the workload indicator comprises using a longer program time in response to a relatively slow host demand.

12. The method of claim 1, wherein the workload indicator comprises a priority level associated with an operation comprising at least one of a user data operation, a metadata operation, and a garbage collection operation.

13. A storage drive comprising:
   a solid state storage device;
   a controller configured to obtain a workload indicator, and reduce wear on the storage device by adjusting an operation execution speed for the storage device responsive to at least the workload indicator, wherein adjusting the operation execution speed comprises adjusting a write operation timing parameter.

14. The storage drive of claim 13, wherein the workload indicator comprises a host demand indicator.

15. The storage drive of claim 13, wherein the workload indicator comprises a resource utilization indicator.

16. The storage drive of claim 13, wherein the write operation timing parameter comprises a program operation timing parameter.

17. The storage drive of claim 13, wherein the write operation timing parameter comprises an erase operation timing parameter.

18. The storage drive of claim 13, wherein the write operation timing parameter comprises at least one of a voltage level parameter defining an amplitude for a programming voltage pulse, a voltage level parameter defining an amplitude for an erase voltage pulse, a pulse duration parameter defining a pulse duration for a programming voltage pulse, a pulse duration parameter defining a pulse duration for an erase voltage pulse, a number of pulses parameter defining a number of programming pulses used in a programming pulse sequence, and a number of pulses parameter defining a number of erase pulses used in an erase pulse sequence.

19. The storage drive of claim 13, wherein the storage device comprises a NAND flash storage device.

20. A non-transitory computer-readable storage medium comprising instructions that cause one or more processors of a storage drive to:
   obtain a workload indicator; and
   reduce wear on a solid state storage device of the storage device by adjusting an operation execution speed for the solid state storage device responsive to at least the workload indicator, wherein adjusting the operation execution speed comprises adjusting a write operation timing parameter.

* * * * *